(12) United States Patent
Gillaspie et al.

(10) Patent No.: US 10,684,523 B2
(45) Date of Patent: *Jun. 16, 2020

(54) COUNTER ELECTRODE FOR ELECTROCHROMIC DEVICES

(71) Applicant: View, Inc., Milpitas, CA (US)

(72) Inventors: Dane Gillaspie, Fremont, CA (US); Anshu A. Pradhan, Collierville, TN (US); Sridhar K. Kailasam, Fremont, CA (US)

(73) Assignee: VIEW, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/204,540

(22) Filed: Nov. 29, 2018

(65) Prior Publication Data

US 2019/0107763 A1 Apr. 11, 2019

Related U.S. Application Data

(63) Continuation of application No. 15/507,734, filed as application No. PCT/US2015/047891 on Sep. 1, 2015, now Pat. No. 10,345,671.
(Continued)

(51) Int. Cl.
*G02F 1/153* (2006.01)
*G02B 26/00* (2006.01)
(Continued)

(52) U.S. Cl.
CPC ............ *G02F 1/1523* (2013.01); *C23C 14/34* (2013.01); *G02F 1/153* (2013.01); *G02F 1/155* (2013.01);
(Continued)

(58) Field of Classification Search
CPC .......... G02F 1/167; G02F 1/0316; G02F 3/16; G02F 1/163; G02F 1/155; G02F 1/1523; G02F 1/1525; G02F 1/1521; G02F 1/133; G02F 1/061; G02F 2001/1678; G02F 1/1533; G02F 1/03; G02B 26/00;
(Continued)

(56) References Cited

U.S. PATENT DOCUMENTS 3,971,624 A 7/1976 Bruesch et al.
4,009,935 A 3/1977 Faughnan et al.
(Continued)

FOREIGN PATENT DOCUMENTS

CN 1207182 A 2/1999
CN 1245540 A 2/2000
(Continued)

OTHER PUBLICATIONS

U.S. Office Action dated Sep. 11, 2017 for U.S. Appl. No. 15/587,114.
(Continued)

*Primary Examiner* — Dawayne Pinkney
(74) *Attorney, Agent, or Firm* — Weaver Austin Villeneuve & Sampson LLP; Brian D. Griedel

(57) ABSTRACT

The embodiments herein relate to electrochromic stacks, electrochromic devices, and methods and apparatus for making such stacks and devices. In various embodiments, an anodically coloring layer in an electrochromic stack or device is fabricated to include nickel-tungsten-tin-oxide (NiWSnO). This material is particularly beneficial in that it is very transparent in its clear state.

21 Claims, 14 Drawing Sheets

Related U.S. Application Data

(60) Provisional application No. 62/046,864, filed on Sep. 5, 2014.

(51) Int. Cl.
*G02F 1/03* (2006.01)
*G02F 1/15* (2019.01)
*G02F 1/133* (2006.01)
*G09G 3/38* (2006.01)
*G02F 1/1523* (2019.01)
*C23C 14/34* (2006.01)
*G02F 1/155* (2006.01)
*G02F 1/1524* (2019.01)

(52) U.S. Cl.
CPC .... *G02F 1/1524* (2019.01); *G02F 2001/1536* (2013.01); *G02F 2001/1555* (2013.01); *G02F 2202/06* (2013.01)

(58) Field of Classification Search
CPC .......... G02B 26/08; G02B 26/26; C09K 9/02; B60R 1/088; H04N 9/3137; H04N 9/22
USPC ........ 359/296, 253–254, 245–247, 290–291, 359/298, 265–275, 277, 242; 349/33; 345/49, 105, 107; 430/31–32
See application file for complete search history.

(56) References Cited

U.S. PATENT DOCUMENTS

| | | |
|---|---|---|
| 4,264,150 A | 4/1981 | Yano et al. |
| 4,293,194 A | 10/1981 | Takahashi |
| 4,297,006 A | 10/1981 | Bissar |
| 4,396,253 A | 8/1983 | Kuwagaki et al. |
| 4,482,216 A | 11/1984 | Hashimoto |
| 4,561,729 A | 12/1985 | Heinz et al. |
| 4,832,463 A | 5/1989 | Goldner et al. |
| 4,851,095 A | 7/1989 | Scobey et al. |
| 4,923,289 A | 5/1990 | Demiryont |
| 4,938,571 A | 7/1990 | Cogan et al. |
| 5,019,420 A | 5/1991 | Rauh |
| 5,124,832 A | 6/1992 | Greenberg et al. |
| 5,138,481 A | 8/1992 | Demiryont |
| 5,142,406 A | 8/1992 | Lampert et al. |
| 5,209,980 A | 5/1993 | Spindler |
| 5,216,536 A | 6/1993 | Agrawal et al. |
| 5,657,150 A | 8/1997 | Kallman et al. |
| 5,659,417 A | 8/1997 | Van Dine et al. |
| 5,666,771 A | 9/1997 | Macquart et al. |
| 5,699,192 A | 12/1997 | Van Dine et al. |
| 5,724,175 A | 3/1998 | Hichwa et al. |
| 5,724,177 A | 3/1998 | Ellis, Jr. et al. |
| 5,754,329 A | 5/1998 | Coleman |
| 5,757,537 A | 5/1998 | Ellis, Jr. et al. |
| 5,814,195 A | 9/1998 | Lehan et al. |
| 5,831,760 A | 11/1998 | Hashimoto et al. |
| 5,847,858 A | 12/1998 | Krings et al. |
| 5,859,723 A | 1/1999 | Jodicke et al. |
| 5,910,854 A | 6/1999 | Varaprasad |
| 6,020,987 A | 2/2000 | Baumann et al. |
| 6,178,034 B1 | 1/2001 | Allemand |
| 6,185,034 B1 | 2/2001 | Nakamura et al. |
| 6,211,995 B1 | 4/2001 | Azens et al. |
| 6,266,177 B1 | 7/2001 | Allemand et al. |
| 6,277,523 B1 | 8/2001 | Giron |
| 6,337,758 B1 | 1/2002 | Beteille et al. |
| 6,515,787 B1 | 2/2003 | Westfall et al. |
| 6,529,308 B2 | 3/2003 | Beteille et al. |
| 6,559,411 B2 | 5/2003 | Borgeson et al. |
| 6,791,737 B2 | 9/2004 | Giron |
| 6,791,738 B2 | 9/2004 | Reynolds et al. |
| 6,822,778 B2 | 11/2004 | Westfall et al. |
| 6,856,444 B2 | 2/2005 | Ingalls et al. |
| 6,859,297 B2 | 2/2005 | Lee et al. |
| 6,919,530 B2 | 7/2005 | Borgeson et al. |
| 6,940,628 B2 | 9/2005 | Giron |
| 7,099,062 B2 | 8/2006 | Azens et al. |
| 7,193,763 B2 | 3/2007 | Beteille et al. |
| 7,230,748 B2 | 6/2007 | Giron et al. |
| 7,265,891 B1 | 9/2007 | Demiryont |
| 7,277,215 B2 | 10/2007 | Greer |
| 7,372,610 B2 | 5/2008 | Burdis et al. |
| 7,531,101 B2 | 5/2009 | Beteille |
| 7,564,611 B2 | 7/2009 | Jang et al. |
| 7,593,154 B2 | 9/2009 | Burdis et al. |
| 7,604,717 B2 | 10/2009 | Beteille et al. |
| 7,646,526 B1 | 1/2010 | Wang et al. |
| 7,704,555 B2 | 4/2010 | Demiryont |
| 7,830,585 B2 | 11/2010 | Widjaja et al. |
| 7,869,114 B2 | 1/2011 | Valentin et al. |
| 7,894,120 B2 | 2/2011 | Valentin et al. |
| 8,004,744 B2 | 8/2011 | Burdis et al. |
| 8,031,389 B2 | 10/2011 | Wang et al. |
| 8,168,265 B2 | 5/2012 | Kwak et al. |
| 8,228,592 B2 | 7/2012 | Wang et al. |
| 8,300,298 B2 | 10/2012 | Wang et al. |
| 8,432,603 B2 | 4/2013 | Wang et al. |
| 8,582,193 B2 | 11/2013 | Wang et al. |
| 8,638,487 B2 | 1/2014 | Veerasamy |
| 8,687,261 B2 | 4/2014 | Gillaspie et al. |
| 8,749,868 B2 | 6/2014 | Wang et al. |
| 8,758,575 B2 | 6/2014 | Wang et al. |
| 8,764,950 B2 | 7/2014 | Wang et al. |
| 8,764,951 B2 | 7/2014 | Wang et al. |
| 8,773,747 B2 | 7/2014 | Ferreira et al. |
| 9,007,674 B2 | 4/2015 | Kailasam et al. |
| 9,116,409 B1 | 8/2015 | Sun et al. |
| 9,140,951 B2 | 9/2015 | Wang et al. |
| 9,164,346 B2 | 10/2015 | Wang et al. |
| 9,261,751 B2 | 2/2016 | Pradhan et al. |
| 9,334,557 B2 | 5/2016 | Neudecker et al. |
| 9,454,053 B2 | 9/2016 | Strong et al. |
| 9,477,129 B2 | 10/2016 | Kozlowski et al. |
| 9,664,974 B2 | 5/2017 | Kozlowski et al. |
| 9,671,664 B2 | 6/2017 | Pradhan et al. |
| 9,720,298 B2 | 8/2017 | Wang et al. |
| 9,759,975 B2 | 9/2017 | Wang et al. |
| 9,904,138 B2 | 2/2018 | Kailasam et al. |
| 10,054,833 B2 | 8/2018 | Kailasam et al. |
| 10,088,729 B2 | 10/2018 | Wang et al. |
| 10,156,762 B2 | 12/2018 | Gillaspie et al. |
| 10,185,197 B2 | 1/2019 | Pradhan et al. |
| 10,228,601 B2 | 3/2019 | Gillaspie et al. |
| 10,254,615 B2 | 4/2019 | Kailasam et al. |
| 10,261,381 B2 | 4/2019 | Pradhan et al. |
| 10,345,671 B2 | 7/2019 | Gillaspie et al. |
| 2003/0010957 A1 | 1/2003 | Haering et al. |
| 2003/0156313 A1 | 8/2003 | Serra et al. |
| 2004/0150867 A1 | 8/2004 | Lee et al. |
| 2005/0147825 A1 | 7/2005 | Arnaud et al. |
| 2005/0259310 A1 | 11/2005 | Giri et al. |
| 2006/0209383 A1 | 9/2006 | Burdis et al. |
| 2007/0008603 A1 | 1/2007 | Sotzing et al. |
| 2007/0008605 A1 | 1/2007 | Garg et al. |
| 2007/0097481 A1 | 5/2007 | Burdis et al. |
| 2007/0292606 A1 | 12/2007 | Demiryont |
| 2008/0304130 A1 | 12/2008 | Nguyen |
| 2008/0304131 A1 | 12/2008 | Nguyen |
| 2009/0057137 A1 | 3/2009 | Pitts et al. |
| 2009/0285978 A1 | 11/2009 | Burdis et al. |
| 2009/0304912 A1 | 12/2009 | Kwak et al. |
| 2009/0323156 A1 | 12/2009 | Shin et al. |
| 2009/0323158 A1 | 12/2009 | Wang et al. |
| 2010/0007937 A1 | 1/2010 | Widjaja et al. |
| 2010/0103496 A1 | 4/2010 | Schwendeman et al. |
| 2010/0165440 A1 | 7/2010 | Nguyen et al. |
| 2010/0243427 A1 | 9/2010 | Kozlowski et al. |
| 2010/0245973 A1 | 9/2010 | Wang et al. |
| 2011/0043885 A1 | 2/2011 | Lamine et al. |
| 2011/0043886 A1 | 2/2011 | Jeon et al. |
| 2011/0151283 A1 | 6/2011 | Gillaspie et al. |
| 2011/0211247 A1 | 9/2011 | Kozlowski et al. |
| 2011/0249314 A1 | 10/2011 | Wang et al. |

(56) References Cited

U.S. PATENT DOCUMENTS

| | | |
|---|---|---|
| 2011/0266137 A1 | 11/2011 | Wang et al. |
| 2011/0266138 A1 | 11/2011 | Wang et al. |
| 2011/0267674 A1 | 11/2011 | Wang et al. |
| 2011/0267675 A1 | 11/2011 | Wang et al. |
| 2011/0297535 A1 | 12/2011 | Higdon et al. |
| 2011/0299149 A1 | 12/2011 | Park et al. |
| 2012/0181167 A1 | 7/2012 | Jiang et al. |
| 2012/0200908 A1 | 8/2012 | Bergh et al. |
| 2012/0275008 A1 | 11/2012 | Pradhan et al. |
| 2012/0276734 A1 | 11/2012 | van Mol et al. |
| 2013/0003157 A1 | 1/2013 | Wang et al. |
| 2013/0016417 A1 | 1/2013 | Veerasamy |
| 2013/0101751 A1 | 4/2013 | Berland et al. |
| 2013/0182307 A1 | 7/2013 | Gillaspie et al. |
| 2013/0270105 A1 | 10/2013 | Wang et al. |
| 2013/0286459 A1 | 10/2013 | Burdis et al. |
| 2014/0177027 A1 | 6/2014 | Wang et al. |
| 2014/0204444 A1 | 7/2014 | Choi et al. |
| 2014/0204445 A1 | 7/2014 | Choi et al. |
| 2014/0204446 A1 | 7/2014 | Choi et al. |
| 2014/0204447 A1 | 7/2014 | Choi et al. |
| 2014/0204448 A1 | 7/2014 | Bergh et al. |
| 2014/0205746 A1 | 7/2014 | Choi et al. |
| 2014/0205748 A1 | 7/2014 | Choi et al. |
| 2014/0313561 A1 | 10/2014 | Wang et al. |
| 2015/0131140 A1 | 5/2015 | Kailasam et al. |
| 2015/0362763 A1 | 12/2015 | Wheeler et al. |
| 2015/0370139 A1 | 12/2015 | Wang et al. |
| 2016/0011480 A1 | 1/2016 | Pradhan et al. |
| 2016/0026055 A1 | 1/2016 | Choi et al. |
| 2016/0209722 A1 | 7/2016 | Wang et al. |
| 2017/0003564 A1 | 1/2017 | Gillaspie et al. |
| 2017/0097552 A1 | 4/2017 | Pradhan et al. |
| 2017/0176832 A1 | 6/2017 | Pradhan et al. |
| 2017/0184937 A1 | 6/2017 | Wang et al. |
| 2017/0255076 A1 | 9/2017 | Gillaspie et al. |
| 2017/0299933 A1 | 10/2017 | Kailasam et al. |
| 2017/0329200 A1 | 11/2017 | Wang et al. |
| 2017/0357135 A1 | 12/2017 | Gillaspie et al. |
| 2017/0371221 A1 | 12/2017 | Gillaspie et al. |
| 2018/0052374 A1 | 2/2018 | Wang et al. |
| 2018/0173071 A1 | 6/2018 | Mathew et al. |
| 2018/0203320 A1 | 7/2018 | Kailasam et al. |
| 2018/0231858 A1 | 8/2018 | Kailasam et al. |
| 2019/0064623 A1 | 2/2019 | Gillaspie et al. |
| 2019/0113819 A1 | 4/2019 | Pradhan et al. |
| 2019/0171078 A1 | 6/2019 | Pradhan et al. |
| 2019/0171079 A1 | 6/2019 | Gillaspie et al. |
| 2019/0187531 A1 | 6/2019 | Pradhan et al. |
| 2019/0302561 A1 | 10/2019 | Rozbicki et al. |

FOREIGN PATENT DOCUMENTS

| | | |
|---|---|---|
| CN | 1492274 A | 4/2004 |
| CN | 101188886 A | 5/2005 |
| CN | 1688923 A | 10/2005 |
| CN | 1710481 A | 12/2005 |
| CN | 1738885 A | 2/2006 |
| CN | 101377599 A | 3/2009 |
| CN | 101419374 A | 4/2009 |
| CN | 101833932 A | 9/2010 |
| CN | 102099736 A | 6/2011 |
| CN | 102230172 A | 11/2011 |
| CN | 102388340 A | 3/2012 |
| CN | 102388341 A | 3/2012 |
| CN | 102414610 A | 4/2012 |
| CN | 102455560 A | 5/2012 |
| CN | 102576818 A | 7/2012 |
| CN | 102666778 A | 9/2012 |
| CN | 102934009 A | 2/2013 |
| CN | 102998870 A | 3/2013 |
| CN | 103135306 A | 6/2013 |
| CN | 1928685 A | 3/2017 |
| EP | 0497616 A2 | 5/1992 |
| EP | 1918412 A1 | 5/2008 |
| JP | S55-124440 U | 9/1980 |
| JP | S57-81242 A | 5/1982 |
| JP | S58-33223 A | 2/1983 |
| JP | S58-139128 A | 8/1983 |
| JP | S58-163921 A | 9/1983 |
| JP | S59-040625 A | 3/1984 |
| JP | S60-066238 A | 4/1985 |
| JP | S60-078423 A | 5/1985 |
| JP | S60-078424 A | 5/1985 |
| JP | S60-202429 A | 10/1985 |
| JP | H03-500096 A | 1/1991 |
| JP | H04-211227 A | 8/1992 |
| JP | H05-182512 A | 7/1993 |
| JP | H10-501847 A | 2/1998 |
| JP | 2004-309926 A | 11/2004 |
| JP | 2006-235632 A | 9/2006 |
| JP | 2007/108750 A | 4/2007 |
| JP | 2008-026605 A | 2/2008 |
| JP | 2008/197679 A | 8/2008 |
| JP | 2010-509720 | 3/2010 |
| JP | 2010-509720 | 3/2010 |
| JP | 2012-523018 A | 9/2012 |
| JP | 2013-525860 A | 6/2013 |
| KR | 10-2006-0092362 | 8/2006 |
| KR | 10-2008-0051280 | 6/2008 |
| KR | 10-2014-0068026 A | 6/2014 |
| KR | 10-2010733 B1 | 8/2019 |
| KR | 10-2010755 B1 | 8/2019 |
| TW | 490391 B | 6/2002 |
| TW | 200417280 A | 9/2004 |
| TW | 2014/35464 A | 9/2014 |
| TW | 2014/39371 A | 10/2014 |
| WO | WO98/47613 A1 | 10/1998 |
| WO | WO2004/087985 A2 | 10/2004 |
| WO | WO2008/055824 | 5/2008 |
| WO | WO2008/154517 A2 | 12/2008 |
| WO | WO2009/000547 A2 | 12/2008 |
| WO | WO2009/029111 A1 | 3/2009 |
| WO | WO2009/148861 | 12/2009 |
| WO | WO2010/120537 A2 | 10/2010 |
| WO | WO2010/147494 A1 | 12/2010 |
| WO | WO2012/138281 | 10/2012 |
| WO | WO2013/054367 A1 | 4/2013 |
| WO | WO2014/025876 A2 | 2/2014 |
| WO | WO2014/025900 | 2/2014 |
| WO | WO2014/113795 A1 | 7/2014 |
| WO | WO2014/113796 A1 | 7/2014 |
| WO | WO2014/113801 A1 | 7/2014 |
| WO | WO2015/168166 A1 | 11/2015 |

OTHER PUBLICATIONS

U.S. Notice of Allowance dated Dec. 4, 2017 for U.S. Appl. No. 15/587,114.
U.S. Notice of Allowance dated Mar. 26, 2018 for U.S. Appl. No. 15/587,114.
Preliminary Amendment filed Aug. 3, 2018 in U.S. Appl. No. 15/916,142.
U.S. Office Action dated Jul. 10, 2018 for U.S. Appl. No. 15/953,327.
U.S. Notice of Allowance dated Nov. 28, 2018 for U.S. Appl. No. 15/953,327.
U.S. Office Action, dated Apr. 26, 2012, issued in U.S. Appl. No. 12/772,055.
U.S. Notice of Allowance, dated Sep. 18, 2012, issued in U.S. Appl. No. 12/772,055.
U.S. Office Action dated Jan. 20, 2012 issued in U.S. Appl. No. 12/772,075.
U.S. Office Action dated Aug. 16, 2012 issued in U.S. Appl. No. 12/772,075.
U.S. Office Action dated Dec. 26, 2012 in U.S. Appl. No. 12/772,075.
U.S. Notice of Allowance dated Jul. 10, 2013 in U.S. Appl. No. 12/772,075.
U.S. Office Action dated Jun. 25, 2013 in U.S. Appl. No. 13/610,684.
U.S. Notice of Allowance dated Jan. 21, 2014 in U.S. Appl. No. 13/610,684.
U.S. Office Action dated Aug. 6, 2014 in U.S. Appl. No. 14/052,455.

(56) References Cited

OTHER PUBLICATIONS

U.S. Notice of Allowance dated Jan. 22, 2015 in U.S. Appl. No. 14/052,455.
U.S. Notice of Allowance dated May 11, 2015 in U.S. Appl. No. 14/052,455.
U.S. Notice of Allowance dated May 28, 2015 in U.S. Appl. No. 14/209,993.
U.S. Notice of Allowance dated Aug. 4, 2015 in U.S. Appl. No. 14/209,993.
U.S. Office Action dated Jul. 28, 2016 in U.S. Appl. No. 14/841,511.
U.S. Notice of Allowance dated Jan. 11, 2017 in U.S. Appl. No. 14/841,511.
U.S. Notice of Allowance dated May 22, 2018 in U.S. Appl. No. 15/457,609.
U.S. Office Action dated Oct. 25, 2011 issued in U.S. Appl. No. 13/166,537.
U.S. Office Action dated Feb. 16, 2012 issued in U.S. Appl. No. 13/166,537.
U.S. Notice of Allowance dated May 31, 2012 issued in U.S. Appl. No. 13/166,537.
U.S. Notice of Allowance dated Feb. 14, 2014 for U.S. Appl. No. 13/627,798.
U.S. Office Action dated Nov. 20, 2012 in U.S. Appl. No. 12/814,277.
U.S. Final Office Action dated Jun. 27, 2013 in U.S. Appl. No. 12/814,277.
U.S. Notice of Allowance dated Mar. 12, 2014 in U.S. Appl. No. 12/814,277.
U.S. Office Action dated Nov. 20, 2012 in U.S. Appl. No. 12/814,279.
U.S. Final Office Action dated Jun. 27, 2013 in U.S. Appl. No. 12/814,279.
U.S. Notice of Allowance dated Mar. 17, 2014 in U.S. Appl. No. 12/814,279.
Australian Examination Report dated Jan. 6, 2014 in AU Application No. 2011245431.
Australian Examination Report dated Apr. 19, 2016 in AU Application No. 2014210572.
Australian Examination Report dated Jun. 7, 2018 in AU Application No. 2017202249.
Chinese Office Action dated Jan. 8, 2015 in CN Application No. CN201180027892.9.
Chinese Office Action dated Aug. 31, 2015 in CN Application No. CN201180027892.9.
Chinese Office Action dated Mar. 31, 2016 in CN Application No. CN201180027892.9.
Chinese Office Action dated Aug. 28, 2018 in CN Application No. CN201610412630.9.
European Search Report dated May 13, 2014 in EP Application No. 11775488.7.
European Office Action dated Feb. 10, 2017 in EP Application No. 11775488.7.
European Office Action dated Oct. 16, 2017 in EP Application No. 11775488.7.
Indian Office Action dated Jun. 19, 2018 in IN Application No. 3663/KOLNP/2012.
Japanese Office Action dated Jan. 6, 2015 in JP Application No. JP2013-508130.
Japanese Office Action dated Mar. 8, 2016 in JP Application No. JP2015-118553.
Japanese Office Action dated Nov. 21, 2017 in JP Application No. JP2016-215029.
Korean Office Action dated Feb. 28, 2017 in KR Application No. 10-2012-7031407.
Korean Office Action dated Feb. 8, 2018 in KR Application No. 10-2018-7002491.
Korean Office Action dated Oct. 30, 2018 in KR Application No. 10-2018-7030647.
Mexican Office Action dated Jun. 6, 2013 in MX Application No. MX/a/2012/012573.
Russian Office Action dated Feb. 25, 2015 in RU Application No. 2012151304.
Singapore Examination Report dated Nov. 5, 2013 in SG Application No. 201208018-0.
Taiwanese Office Action dated Jul. 22, 2015 in TW Application No. 100115190.
Taiwanese Office Action dated Jun. 1, 2016 in TW Application No. 104144317.
Taiwanese Decision of Rejection dated Nov. 29, 2016 in TW Application No. 104144317.
Taiwanese Search Report dated Oct. 11, 2018 in TW Application No. 106118525.
International Search Report and Written Opinion, dated Jul. 7, 2011, issued in PCT/US2011/033822.
International Preliminary Report on Patentability, dated Nov. 15, 2012 in PCT/US2011/033822.
U.S. Notice of Allowance dated Nov. 25, 2015 in U.S. Appl. No. 13/462,725.
U.S. Office Action dated Aug. 12, 2016 in U.S. Appl. No. 14/683,541.
U.S. Notice of Allowance dated Jan. 27, 2017 in U.S. Appl. No. 14/683,541.
U.S. Notice of Allowance (corrected) dated Feb. 27, 2017 in U.S. Appl. No. 14/683,541.
U.S. Office Action dated Jan. 14, 2015 in U.S. Appl. No. 13/462,725.
U.S. Final Office Action dated Jul. 23, 2015 in U.S. Appl. No. 13/462,725.
U.S. Office Action dated Apr. 5, 2018 in U.S. Appl. No. 15/441,130.
U.S. Notice of Allowance dated Oct. 31, 2018 in U.S. Appl. No. 15/441,130.
Chinese Office Action dated Sep. 28, 2016 in CN Application No. 201380031908.2.
European Search Report (Partial Supplementary) dated Jan. 8, 2016 in EP Application No. 13785049.1.
European Search Report (Extended) dated Apr. 6, 2016 in EP Application No. 13785049.1.
International Search Report and Written Opinion, dated Aug. 14, 2013 in PCT/US2013/038481.
International Preliminary Report on Patentability dated Nov. 13, 2014 in PCT/US2013/038481.
Taiwanese Office Action dated May 26, 2016 in TW Application No. 100115201.
Taiwanese Decision of Rejection dated Feb. 24, 2017 in TW Application No. 100115201.
International Search Report and Written Opinion, dated Sep. 14, 2011, issued in PCT/US2011/033906.
International Preliminary Report on Patentability dated Nov. 15, 2012 in PCT/US2011/033906.
U.S. Office Action dated Dec. 30, 2016 in U.S. Appl. No. 15/004,794.
U.S. Notice of Allowance dated Apr. 12, 2017 in U.S. Appl. No. 15/004,794.
U.S. Notice of Allowance dated Aug. 9, 2017 in U.S. Appl. No. 15/004,794.
U.S. Office Action dated Jun. 27, 2018 in U.S. Appl. No. 15/612,928.
European Search Report (Extended) dated Nov. 28, 2017 in EP Application No. 15785437.3.
European Office Action dated Oct. 23, 2018 in EP Application No. 15785437.3.
International Search Report and Written Opinion dated Jul. 16, 2015 in PCT/US15/028899.
International Preliminary Report on Patentability dated Nov. 17, 2016 in PCT/US15/028899.
U.S. Office Action dated Sep. 20, 2018 for U.S. Appl. No. 15/340,853.
European Search Report (Extended) dated Dec. 1, 2017 in EP Application No. 15785891.1.
International Preliminary Report on Patentability dated Nov. 17, 2016 in PCT/US15/28067.
International Search Report and Written Opinion dated Aug. 26, 2015 in PCT/US15/28067.
International Search Report and Written Opinion (ISA/KR) dated Jul. 7, 2017 in PCT/US17/24120.
International Preliminary Report on Patentability dated Oct. 4, 2018 in PCT/US17/24120.
U.S. Office Action dated May 15, 2018 for U.S. Appl. No. 15/507,734.
U.S. Notice of Allowance dated Sep. 25, 2018 for U.S. Appl. No. 15/507,734.

(56) References Cited

OTHER PUBLICATIONS

European Search Report (Extended) dated Jan. 29, 2018 in EP Application No. 15837472.8.
International Search Report and Written Opinion dated Mar. 18, 2016 in PCT/US15/47891.
International Preliminary Report on Patentability dated Mar. 16, 2017 in PCT/US15/47891.
U.S. Office Action dated May 15, 2018 for U.S. Appl. No. 15/527,194.
U.S. Notice of Allowance dated Sep. 24, 2018 for U.S. Appl. No. 15/527,194.
U.S. Office Action dated May 25, 2018 for U.S. Appl. No. 15/526,969.
International Search Report and Written Opinion dated Mar. 7, 2016 in PCT/US15/61995.
International Preliminary Report on Patentability dated Jun. 8, 2017 in PCT/US15/61995.
U.S. Notice of Allowance dated Oct. 18, 2018 for U.S. Appl. No. 15/526,969.
U.S. Notice of Allowance (Corrected) dated Nov. 28, 2018 for U.S. Appl. No. 15/526,969.
International Search Report and Written Opinion dated Feb. 29, 2016 in PCT/US15/61668.
International Preliminary Report on Patentability dated Jun. 8, 2017 in PCT/US15/61668.
International Search Report and Written Opinion dated Oct. 18, 2016 in PCT/US16/41375.
International Preliminary Report on Patentability dated Jan. 25, 2018 in PCT/US16/41375.
European Search Report (Extended) dated May 2, 2018 in EP Application No. 15862207.6.
European Search Report (Extended) dated May 24, 2018 in EP Application No. 15863517.7.
Arvizu, M.A. et al., "Electrochromic W1—x—yTixMoyO3 thin films made by sputter deposition: Large optical modulation, good cycling durability, and approximate color neutrality," Chemistry of Materials [online, just accepted manuscript], Feb. 23, 2017, [retrieved on Feb. 24, 2017]. Retrieved from the internet: <http://pubs.acs.org> <DOI: 10.1021/acs.chemmater.6b05198>.
Avendano, E. et al., "Electrochromic Nickel-Oxide-Based Films with Minimized Bleached-State Absorptance," I 203rd Meeting of the Electrochemical Society, Electrochemical Society Proceedings vol. 2003-17, 2003, pp. 80-90.
Burdis, et al., "Technology Advancements to Lower Costs of Electrochromic Window Glazings", Sage Electronics, Inc., DE-PS26-06NT42764, Final Report, dated Apr. 2, 2010.
Hersh, H.N., "Mechanism of Electrochromism in WO3," Applied Physics Letters, vol. 27, No. 12, Dec. 15, 1975, pp. 646-648.
Hutchins, M.G. et al, "The electrochromic behavior of tin-nickel oxide," Solar Energy Materials and Solar Cells, vol. 54, 1998, pp. 75-84.
Green, Sara, "Electrochromic nickel-tungsten oxides: optical, electrochemical and structural characterization of sputter-deposited thin films in the whole composition range," Dissertation, Digital Comprehensive Summaries of Uppsala Dissertations from the Faculty of Science and Technology 963, Uppsala University, Sweden, 2012.
Velux SageGlass Flyer, 2007, 4 pages.
Vink, et al., "Lithium Trapping at Excess Oxygen in Sputter-Deposited a-WO3 Films", Japanese Journal of Applied Physics, vol. 8, No. 3, Feb. 1, 1999, pp. 1540-1544.
Yoshimura, et al., "Electrochromism in a Thin-Film Device Using $Li_2WO_4$ as an Li-Electrolyte", Japanese Journal of Applied Physics, vol. 22, No. 1, Jan. 1983, pp. 152-156.
U.S. Appl. No. 16/205,084, filed Nov. 29, 2018, Pradhan et al.
U.S. Appl. No. 16/088,024, filed Sep. 24, 2018, Pradhan et al.
U.S. Appl. No. 16/168,587, filed Oct. 23, 2018, Pradhan et al.
U.S. Appl. No. 16/204,540, filed Nov. 29, 2018, Gillaspie et al.
Preliminary Amendment filed Sep. 24, 2018 for U.S. Appl. No. 16/088,024.
U.S. Office Action dated Dec. 31, 2018 in U.S. Appl. No. 15/795,843.
U.S. Notice of Allowance dated Jul. 17, 2019 in U.S. Appl. No. 15/795,843.
U.S. Notice of Allowance dated Dec. 3, 2019 in U.S. Appl. No. 15/795,843.
U.S. Office Action dated Jan. 23, 2019 in U.S. Appl. No. 15/612,928.
U.S. Notice of Allowance dated Jul. 26, 2019 in U.S. Appl. No. 15/612,928.
U.S. Notice of Allowance dated Dec. 19, 2019 in U.S. Appl. No. 15/612,928.
Australian Examination Report dated Dec. 17, 2018 in AU Application No. 2017202249.
Australian Examination Report dated Mar. 18, 2019 in AU Application No. 2017202249.
Chinese Office Action dated Mar. 22, 2019 in CN Application No. CN201610412630.9.
Japanese Office Action dated Mar. 5, 2019 in JP Application No. JP2018-028971.
European Office Action dated May 7, 2019 in EP Application No. 13785049.1.
Russian Office Action dated Mar. 12, 2019 in RU Application No. 2015148673.
Taiwanese Office Action dated Dec. 7, 2018 in TW Application No. 106128807.
Taiwanese Office Action dated Mar. 25, 2019 in TW Application No. 106128807.
Taiwanese Office Action dated Oct. 12, 2018 in TW Application No. 104144317.
Chinese Office Action dated Jun. 15, 2017 in CN Application No. 201380031908.2.
Chinese Office Action dated Dec. 26, 2018 in CN Application No. 201580032579.2.
Chinese Office Action dated Jul. 2, 2019 in CN Application No. 201580032579.2.
Brazilian Office Action dated Sep. 24, 2019 in BR Application No. 1120120278916.
Taiwanese Office Action dated Aug. 26, 2019 in TW Application No. 108106923.
International Search Report and Written Opinion dated Jul. 9, 2019 in PCT/US19/027931.
U.S. Notice of Allowance dated Jan. 3, 2019 for U.S. Appl. No. 15/340,853.
U.S. Notice of Allowance dated Mar. 11, 2019 for U.S. Appl. No. 15/507,734.
U.S. Office Action dated Jul. 25, 2019 for U.S. Appl. No. 16/168,587.
U.S. Office Action dated Feb. 25, 2019 for U.S. Appl. No. 15/204,868.
U.S. Notice of Allowance dated Nov. 21, 2019 for U.S. Appl. No. 15/204,868.
U.S. Office Action dated Aug. 12, 2019 in U.S. Appl. No. 15/916,142.
U.S. Office Action dated Jul. 25, 2019 in U.S. Appl. No. 16/284,876.
U.S. Office Action dated Jul. 25, 2019 in U.S. Appl. No. 16/088,024.
U.S. Final Office Action dated Jan. 6, 2020 in U.S. Appl. No. 16/088,024.
U.S. Office Action dated Jul. 10, 2019 in U.S. Appl. No. 16/250,738.
U.S. Notice of Allowance dated Nov. 6, 2019 in U.S. Appl. No. 16/250,738.
U.S. Notice of Allowability (corrected) dated Jan. 8, 2020 in U.S. Appl. No. 16/250,738.
Chinese Office Action dated Jan. 2, 2020 in CN. Application No. 201580072326.8.
European Search Report (Extended) dated Dec. 14, 2018 in EP Application No. 16824923.3.
Chinese Office Action dated Dec. 27, 2018 in CN Application No. 201580029451.0.
Chinese Office Action dated Jul. 17, 2019 in CN Application No. 201580029451.0.
European Office Action dated Oct. 10, 2019 in EP Application No. 15785891.1.
Japanese Office Action dated Sep. 24, 2019 in JP Application No. 2017-527761.
Russian Office Action dated Apr. 11, 2019 in RU Application No. 2017120233.
Taiwanese Office Action dated Sep. 20, 2019 in TW Application No. 104139219, with summary translation.
Russian Search Report dated Nov. 1, 2019 in RU Application No. 2018105193.

(56) References Cited

OTHER PUBLICATIONS

U.S. Appl. No. 16/660,660, filed Oct. 22, 2019, Kozlowski et al.
U.S. Appl. No. 16/719,700, filed Dec. 18, 2019, Kozlowski et al.
U.S. Appl. No. 16/721,655, filed Dec. 19, 2019, Gillaspie et al.
Preliminary Amendment filed Dec. 23, 2019 for U.S. Appl. No. 16/721,655.
U.S. Final Office Action dated Jan. 31, 2020 in U.S. Appl. No. 15/916,142.
U.S. Notice of Allowance dated Jan. 23, 2020 for U.S. Appl. No. 16/284,876.
Chinese Office Action dated Jan. 22, 2020 in CN Application No. 201580053092.2.
U.S. Appl. No. 16/774,621, filed Jan. 28, 2020, Rozbicki et al.

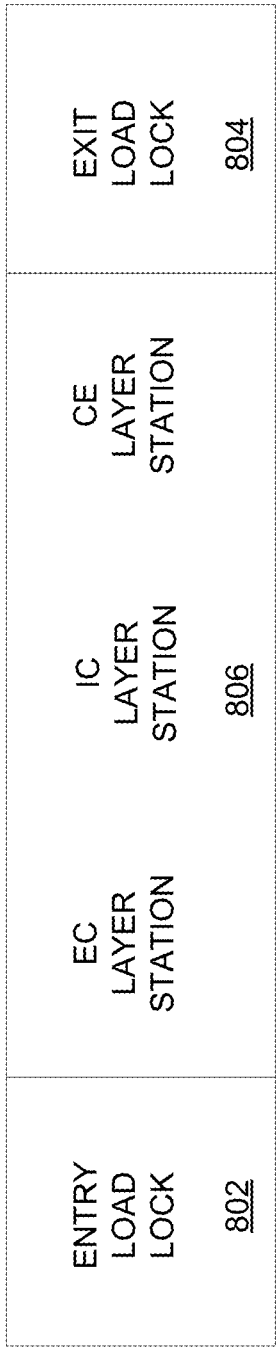
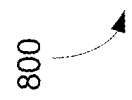
FIGURE 8A
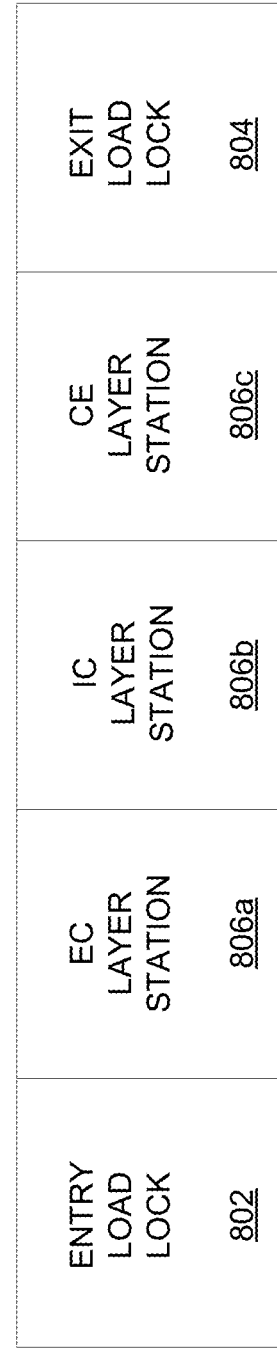
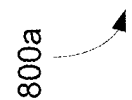
FIGURE 8C

| ENTRY LOAD LOCK 802 | EC LAYER STATION 806a | LITHIUM STATION 807a | IC LAYER STATION 806b | CE LAYER STATION 806c | LITHIUM STATION 807b | TCO LAYER STATION 808 | EXIT LOAD LOCK 804 |

| ENTRY LOAD LOCK 802 | EC LAYER STATION 806a | IC LAYER STATION 806b | CE LAYER STATION 806c | LITHIUM STATION 807 | TCO LAYER STATION 808 | EXIT LOAD LOCK 804 |

Direction of substrate travel

COUNTER ELECTRODE FOR ELECTROCHROMIC DEVICES

CROSS-REFERENCE TO RELATED APPLICATIONS

This application is a continuation of and claims priority to U.S. patent application Ser. No. 15/507,734, filed Feb. 28, 2017, and titled "COUNTER ELECTRODE FOR ELECTROCHROMIC DEVICES," which is a National Phase Applications of PCT/US15/47891, filed Sep. 1, 2015, and titled "COUNTER ELECTRODE FOR ELECTROCHROMIC DEVICES," which claims the benefit of priority to U.S. Provisional Patent Application No. 62/046,864, filed Sep. 5, 2014, and titled "COUNTER ELECTRODE FOR ELECTROCHROMIC DEVICES," each of which is herein incorporated by reference in its entirety and for all purposes.

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance. One well known electrochromic material, for example, is tungsten oxide ($WO_3$). Tungsten oxide is a cathodic electrochromic material in which a coloration transition, transparent to blue, occurs by electrochemical reduction.

Electrochromic materials may be incorporated into, for example, windows and mirrors. The color, transmittance, absorbance, and/or reflectance of such windows and mirrors may be changed by inducing a change in the electrochromic material. One well known application of electrochromic materials, for example, is the rear view mirror in some cars. In these electrochromic rear view mirrors, the reflectivity of the mirror changes at night so that the headlights of other vehicles are not distracting to the driver.

While electrochromism was discovered in the 1960's, electrochromic devices have historically suffered from various problems that have prevented the technology from realizing its full commercial potential.

SUMMARY

The embodiments herein relate to electrochromic materials, electrochromic stacks, electrochromic devices, as well as methods and apparatus for making such materials, stacks, and devices. In various embodiments, a counter electrode material includes a novel composition of materials. For instance, the counter electrode material may include nickel, tungsten, tin, and oxygen; combined as a mixed oxide. The mixed oxide may also include lithium or other charge carrier. These elements may be provided together and represented as "NiWSnO." In certain cases the composition of the counter electrode material satisfies certain conditions. Example conditions may include an atomic ratio of Ni:(W+Sn) that falls between about 1:1 and 4:1, for example between about 1:1 and 3:1, or between about 1.5:1 and 3:1, or between about 1.5:1 and 2.5:1, or between about 2:1 and 2.5:1 in certain embodiments. Similarly, in some embodiments the atomic ratio of Ni:(W+Sn) is between about 2:1 and 3:1. Another example condition relates to an atomic ratio of W:Sn in the counter electrode material. The atomic ratio of W:Sn may fall between about 1:9 and 9:1, for example between about 1:1 and 3:1, or between about 1.5:1 and 2.5:1, or between about 1.5:1 and 2:1 in some embodiments. Another example condition relates to an atomic ratio of Ni:W in the counter electrode material. In certain embodiments, the atomic ratio of Ni:W in the counter electrode material is between about 1:1 and 4:1, for example between about 1.5:1 and 3:1, or between about 2:1 and 3:1. One or more of these example conditions may be satisfied by the counter electrode material.

In certain aspects of the disclosed embodiments, the NiWSnO counter electrode material is used to make a stack of electrochromic materials. The NiWSnO material may meet any one or more of the conditions listed above or elsewhere herein. The stack may include a layer of NiWSnO as an anodically coloring material, along with a layer of a cathodically coloring material. One example of a cathodically coloring material is tungsten oxide. In certain embodiments, a layer of an ionically conducting, electronically insulating material is provided between the layer of NiWSnO and the layer of cathodically coloring material. In other cases, the NiWSnO is deposited in direct physical contact with the cathodically coloring material, and no separate ionically conducting, electronically insulating material is provided between these layers. The stack may be used in fabricating an electrochromic device.

In a related aspect of the disclosed embodiments, a method of fabricating an electrochromic stack is provided. The method may include forming a cathodically coloring layer including a cathodically coloring electrochromic material, and forming an anodically coloring layer including nickel-tungsten-tin-oxide (NiWSnO). The NiWSnO may meet any one or more of the conditions described above or elsewhere herein. The method may include depositing the cathodically coloring material layer in direct physical contact with the anodically coloring layer. In other embodiments, an ion conductor layer is deposited in between the anodically coloring layer and the cathodically coloring layer. Forming the anodically coloring layer may include sputtering one or more sputter targets to form the NiWSnO. The sputter targets may include elemental metals and/or alloys of metals, such metals including nickel, tungsten, and tin. The metals in the one or more targets may also be provided as oxides.

In another aspect of the disclosed embodiments, an electrochromic device having a NiWSnO anodically coloring layer is provided. The NiWSnO anodically coloring layer may meet one or more of the conditions described above and elsewhere herein. The electrochromic device may include an electrochromic stack as described above. For instance, the electrochromic device may include a layer of cathodically coloring material in addition to the layer of NiWSnO anodically coloring layer. The NiWSnO may be deposited by the methods described herein. In some embodiments the anodically coloring layer is substantially amorphous. In some cases the anodically coloring layer includes an amorphous matrix of a first material having a second, crystalline, material dispersed throughout the amorphous matrix.

In a further aspect of the disclosed embodiments, an integrated deposition system for fabricating an electrochromic stack is provided. The system may include a plurality of deposition stations aligned in series and interconnected and operable to pass a substrate from one station to the next without exposing the substrate to an external environment, where the plurality of deposition stations include (i) a first deposition station having one or more material sources for depositing a cathodically coloring layer, and (ii) a second deposition station including one or more material sources for depositing an anodically coloring layer including nickeltungsten-tin-oxide (NiWSnO); and a controller having program instructions for passing the substrate through the plurality of stations in a manner that deposits on the substrate (i) the cathodically coloring layer, and (ii) the anodically coloring layer to form a stack including at least the cathodically coloring layer and the anodically coloring layer.

The second deposition station may be configured to deposit the NiWSnO to meet any of the conditions described above or elsewhere herein. In some cases, at least one of the one or more material sources for depositing the NiWSnO includes one or more elemental metals selected from the group consisting of: nickel, tungsten, and tin. In these or other cases, at least one of the one or more material sources for depositing the NiWSnO include an alloy including two or more metals selected from the group consisting of nickel, tungsten, and tin. In these or other cases, at least one of the sputter targets may include an oxide. The sputtering may be done in an oxygen-containing atmosphere in various embodiments.

These and other features and advantages of the embodiments herein will be described in further detail below, with reference to the associated drawings.

BRIEF DESCRIPTION OF THE DRAWINGS

The following detailed description can be more fully understood when considered in conjunction with the drawings in which:

FIG. 8A, depicts an integrated deposition system according to certain embodiments.

FIG. 8C depicts a modular integrated deposition system.

FIG. 8D depicts an integrated deposition system with two lithium deposition stations.

FIG. 8E depicts an integrated deposition system with one lithium deposition station.

DETAILED DESCRIPTION

Electrochromic Devices

Figure 1:
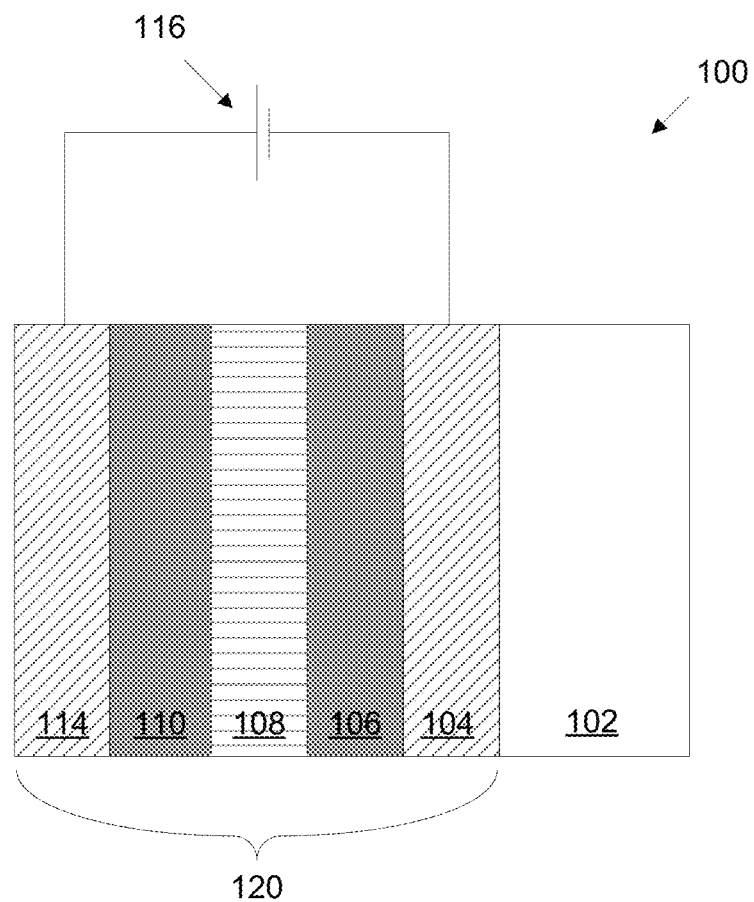
FIG. 1 is a schematic cross-section of an electrochromic device in accordance with certain embodiments.

A schematic cross-section of an electrochromic device 100 in accordance with some embodiments is shown in FIG. 1. The electrochromic device includes a substrate 102, a conductive layer (CL) 104, an electrochromic layer (EC) 106 (sometimes also referred to as a cathodically coloring layer), an ion conducting layer (IC) 108, a counter electrode layer (CE) 110 (sometimes also referred to as an anodically coloring layer), and a conductive layer (CL) 114. Elements 104, 106, 108, 110, and 114 are collectively referred to as an electrochromic stack 120. A voltage source 116 operable to apply an electric potential across the electrochromic stack 120 effects the transition of the electrochromic device from, e.g., a clear state to a tinted state. In other embodiments, the order of layers is reversed with respect to the substrate. That is, the layers are in the following order: substrate, conductive layer, counter electrode layer, ion conducting layer, electrochromic material layer, conductive layer. In some embodiments, the ion conducting layer may be omitted, as discussed further below.

It should be understood that the reference to a transition between a clear state and tinted state is non-limiting and suggests only one example, among many, of an electrochromic transition that may be implemented. Unless otherwise specified herein, whenever reference is made to a clear-to-tinted transition, the corresponding device or process encompasses other optical state transitions such non-reflective-reflective, transparent-opaque, etc. Further the terms "clear" and "bleached" refer to an optically neutral state, e.g., untinted, transparent or translucent. Still further, unless specified otherwise herein, the "color" or "tint" of an electrochromic transition is not limited to any particular wavelength or range of wavelengths. As understood by those of skill in the art, the choice of appropriate electrochromic and counter electrode materials governs the relevant optical transition.

In various embodiments herein, a counter electrode is fabricated to include nickel, tungsten, tin, and oxygen. In such counter electrode materials, the amount of oxygen may vary depending on the stoichiometry of the metals used. The processing conditions used to make the counter electrode may vary between different embodiments, resulting in a wide range of possible compositions (e.g., due to differences in valence states/oxygen availability, etc.). Thus, rather than describing a myriad of possible oxygen amounts available or included in such formulations, "O" is used to represent all the oxygen in the material. The counter electrode materials described herein are useful in lithium ion based electrochromic devices. In such devices, lithium ions are used to drive the optical transitions, and some lithium is irreversibly bound in the electrodes of such devices. The amount of lithium irreversibly bound in the electrodes may vary depending on the embodiment. Further, the counter electrode materials described herein are useful as counter electrode materials, even in cases where the electrochromic device does not rely on/use lithium ions to drive optical transitions. In such embodiments, a different (non-lithium) charge carrier may be used, and may be similarly irreversibly bound within the counter electrode material. As such, in certain cases the stoichiometry of the materials is described in terms of the relative ratio of the "heavy" metal constituents, that is, all metals except e.g., lithium, which may or may not be present in any given embodiment.

In certain embodiments, the electrochromic device reversibly cycles between a clear state and a tinted state. In the clear state, a potential is applied to the electrochromic stack 120 such that available ions in the stack that can cause the electrochromic material 106 to be in the tinted state reside primarily in the counter electrode 110. When the potential on the electrochromic stack is reversed, the ions are transported across the ion conducting layer 108 to the electrochromic material 106 and cause the material to enter the tinted state. A more detailed description of the transition from clear to tinted state, and from tinted to clear state, is included below in the description of FIGS. 2 and 3, but first the individual layers of stack 120 will be described in more detail in relation to FIG. 1.

In certain embodiments, all of the materials making up electrochromic stack 120 are inorganic, solid (i.e., in the solid state), or both inorganic and solid. Because organic materials tend to degrade over time, inorganic materials offer the advantage of a reliable electrochromic stack that can function for extended periods of time. Materials in the solid state also offer the advantage of not having containment and leakage issues, as materials in the liquid state often do. Each of the layers in the electrochromic device is discussed in detail, below. It should be understood that any one or more of the layers in the stack may contain some amount of organic material, but in many implementations one or more of the layers contains little or no organic matter. The same can be said for liquids that may be present in one or more layers in small amounts. It should also be understood that solid state material may be deposited or otherwise formed by processes employing liquid components such as certain processes employing sol-gels or chemical vapor deposition.

Referring again to FIG. 1, voltage source 116 is typically a low voltage electrical source and may be configured to operate in conjunction with radiant and other environmental sensors. Any material having suitable optical, electrical, thermal, and mechanical properties may be used as substrate 102. Such substrates include, for example, glass, plastic, and mirror materials. Suitable plastic substrates include, for example acrylic, polystyrene, polycarbonate, allyl diglycol carbonate, SAN (styrene acrylonitrile copolymer), poly(4-methyl-l-pentene), polyester, polyamide, etc. If a plastic substrate is used, it is preferably barrier protected and abrasion protected using a hard coat of, for example, a diamond-like protection coating, a silica/silicone anti-abrasion coating, or the like, such as is well known in the plastic glazing art. Suitable glasses include either clear or tinted soda lime glass, including soda lime float glass. The glass may be tempered or untempered. In some embodiments of electrochromic device 100 with glass, e.g., soda lime glass, used as substrate 102, there is a sodium diffusion barrier layer (not shown) between substrate 102 and conductive layer 104 to prevent the diffusion of sodium ions from the glass into conductive layer 104.

While the substrate 102 may be of any size, in some embodiments, it is about 0.01 mm to 10 mm thick, preferably about 3 mm to 9 mm thick.

In some embodiments, the substrate is architectural glass. Architectural glass is glass that is used as a building material. Architectural glass is typically used in commercial buildings, but may also be used in residential buildings, and typically, though not necessarily, separates an indoor environment from an outdoor environment. In certain embodiments, architectural glass is at least 20 inches by 20 inches, and can be much larger, e.g., as large as about 72 inches by 120 inches. Architectural glass is typically at least about 2 mm thick.

On top of substrate 102 is conductive layer 104. In certain embodiments, one or both of the conductive layers 104 and 114 is inorganic and/or solid. Conductive layers 104 and 114 may be made from a number of different materials, including conductive oxides, thin metallic coatings, conductive metal nitrides, and composite conductors. Typically, conductive layers 104 and 114 are transparent at least in the range of wavelengths where electrochromism is exhibited by the electrochromic layer. Transparent conductive oxides include metal oxides and metal oxides doped with one or more metals. Examples of such metal oxides and doped metal oxides include indium oxide, indium tin oxide, doped indium oxide, tin oxide, doped tin oxide, zinc oxide, aluminum zinc oxide, doped zinc oxide, ruthenium oxide, doped ruthenium oxide and the like. In some embodiments, commercially available substrates such as glass substrates contain a transparent conductive layer coating. Such products may be used for both substrate 102 and conductive layer 104. Examples of such glasses include conductive layer coated glasses sold under the trademark TEC Glass™ by Pilkington, of Toledo, Ohio and SUNGATE™ 300 and SUNGATE™ 500 by PPG Industries of Pittsburgh, Pa. TEC Glass™ is a glass coated with a fluorinated tin oxide conductive layer. As well, thin glasses such as Gorilla Glass®, Willow Glass® and Eagle XG® (each commercially available from Corning, Inc. of Corning, N.Y.) are suitable substrates for electrochromic devices described herein.

In some embodiments, the same conductive layer is used for both conductive layers (i.e., conductive layers 104 and 114). In some embodiments, different conductive materials are used for each conductive layer 104 and 114. For example, in some embodiments, TEC Glass™ is used for substrate 102 (float glass) and conductive layer 104 (fluorinated tin oxide) and indium tin oxide is used for conductive layer 114. In some embodiments employing TEC Glass™ there is a sodium diffusion barrier between the glass substrate 102 and TEC conductive layer 104.

The function of the conductive layers is to spread an electric potential provided by voltage source 116 over surfaces of the electrochromic stack 120 to interior regions of the stack, with very little ohmic potential drop. The electric potential is transferred to the conductive layers though electrical connections to the conductive layers. In some embodiments, bus bars, one in contact with conductive layer 104 and one in contact with conductive layer 114, provide the electric connection between the voltage source 116 and the conductive layers 104 and 114. The conductive layers 104 and 114 may also be connected to the voltage source 116 with other conventional means.

The sheet resistance ($R_s$) of the conductive layers is also important because of the relatively large area spanned by the layers. In some embodiments, the sheet resistance of conductive layers 104 and 114 is about 1 to 30 Ohms per square, or about 5 to 30 Ohms per square. In some embodiments, the sheet resistance of conductive layers 104 and 114 is about 15 Ohms per square. In general, it is desirable that the sheet resistance of each of the two conductive layers be about the same. In one embodiment, the two layers each have a sheet resistance of about 10-15 Ohms per square.

Overlaying conductive layer 104 is cathodically coloring layer 106 (also referred to as electrochromic layer 106). In some embodiments, electrochromic layer 106 is inorganic and/or solid, in typical embodiments inorganic and solid. The electrochromic layer may contain any one or more of a number of different cathodically coloring electrochromic materials, including metal oxides. Such metal oxides include, e.g., tungsten oxide ($WO_3$), molybdenum oxide ($MoO_3$), niobium oxide ($Nb_2O_5$), titanium oxide ($TiO_2$), vanadium oxide ($V_2O_5$) and tantalum oxide ($Ta_2O_5$). In some embodiments, the cathodically coloring metal oxide is doped with one or more dopants such as lithium, sodium, potassium, molybdenum, vanadium, titanium, and/or other suitable metals or compounds containing metals. Such dopants can be cathodically coloring, anodically coloring, or non-electrochromic, so long as the bulk material is cathodically coloring. For example, mixed oxides (e.g., W—Mo oxide, W—V oxide) are also used in certain embodiments. An electrochromic layer 106 comprising a metal oxide is capable of receiving ions transferred from counter electrode layer 110.

In some embodiments, tungsten oxide or doped tungsten oxide is used for electrochromic layer 106. In one embodiment, the electrochromic layer is made substantially of $WO_x$, where "x" refers to an atomic ratio of oxygen to tungsten in the electrochromic layer, and x is between about 2.7 and 3.5. It has been suggested that only sub-stoichiometric tungsten oxide exhibits electrochromism; i.e., stoichiometric tungsten oxide, $WO_3$, does not exhibit electrochromism. In a more specific embodiment, $WO_x$, where x is less than 3.0 and at least about 2.7 is used for the electrochromic layer. In another embodiment, the electrochromic layer is WOx, where x is between about 2.7 and about 2.9. Techniques such as Rutherford Backscattering Spectroscopy (RBS) can identify the total number of oxygen atoms which include those bonded to tungsten and those not bonded to tungsten. In some instances, tungsten oxide layers where x is 3 or greater exhibit electrochromism, presumably due to unbound excess oxygen along with sub-stoichiometric tungsten oxide. In another embodiment, the tungsten oxide layer has stoichiometric or greater oxygen, where x is 3.0 to about 3.5.

In certain embodiments, the tungsten oxide is crystalline, nanocrystalline, or amorphous. In some embodiments, the tungsten oxide is substantially nanocrystalline, with grain sizes, on average, from about 5 nm to 50 nm (or from about 5 nm to 20 nm), as characterized by transmission electron microscopy (TEM). The tungsten oxide morphology may also be characterized as nanocrystalline using x-ray diffraction (XRD); XRD. For example, nanocrystalline electrochromic tungsten oxide may be characterized by the following XRD features: a crystal size of about 10 to 100 nm (e.g., about 55 nm. Further, nanocrystalline tungsten oxide may exhibit limited long range order, e.g., on the order of several (about 5 to 20) tungsten oxide unit cells.

The thickness of the electrochromic layer 106 depends on the cathodically coloring material selected for the electrochromic layer. In some embodiments, the electrochromic layer 106 is about 50 nm to 2,000 nm, or about 200 nm to 700 nm. In some embodiments, the electrochromic layer is about 300 nm to about 500 nm.

Generally, in cathodically coloring electrochromic materials, the colorization/tinting (or change in any optical property—e.g., absorbance, reflectance, and transmittance) of the electrochromic material is caused by reversible ion insertion into the material (e.g., intercalation) and a corresponding injection of a charge balancing electron. Typically some fraction of the ion responsible for the optical transition is irreversibly bound up in the electrochromic material. As explained below some or all of the irreversibly bound ions are used to compensate "blind charge" in the material. In most electrochromic materials, suitable ions include lithium ions ($Li^+$) and hydrogen ions ($H^+$) (i.e., protons). In some cases, however, other ions will be suitable. These include, for example, deuterium ions ($D^+$), sodium ions ($Na^+$), potassium ions ($K^+$), calcium ions ($Ca^{++}$), barium ions ($Ba^{++}$), strontium ions ($Sr^{++}$), and magnesium ions ($Mg^{++}$). In various embodiments described herein, lithium ions are used to produce the electrochromic phenomena. Intercalation of lithium ions into tungsten oxide ($WO_{3-y}$ (0<y≤~0.3)) causes the tungsten oxide to change from transparent (clear state) to blue (tinted state).

Referring again to FIG. 1, in electrochromic stack 120, ion conducting layer 108 overlays electrochromic layer 106. On top of ion conducting layer 108 is anodically coloring layer 110 (also referred to as counter electrode layer 110). In some embodiments, counter electrode layer 110 is inorganic and/or solid. The counter electrode layer may comprise one or more of a number of different materials that are capable of serving as reservoirs of ions when the electrochromic device is in the clear state. During an electrochromic transition initiated by, e.g., application of an appropriate electric potential, the anodically coloring counter electrode layer transfers some or all of the ions it holds to the cathodically coloring electrochromic layer, changing the electrochromic layer to the tinted state. Concurrently, in the case of NiWSnO, the counter electrode layer tints with the loss of ions.

In various embodiments, the anodically coloring counter electrode material includes nickel, tungsten, tin, and oxygen. The materials may be provided together as NiWSnO, at any appropriate composition. The NiWSnO material is especially beneficial as an anodically coloring material because it is particularly clear and color neutral in the clear state. Many counter electrode materials are slightly tinted (colored) even in their clear states. For instance, NiWO generally has a slight yellow tint in the clear state. For aesthetic reasons, it is preferable that both the cathodically coloring and anodically coloring materials in an electrochromic device are very clear (transparent) and colorless when the device is in the clear state. As such, NiWSnO is a valuable candidate for the anodically coloring counter electrode material.

The NiWSnO may have various compositions when used as an anodically coloring material. In certain embodiments, particular balances may be made between the various components of the NiWSnO. For instance, an atomic ratio of Ni:(W+Sn) in the material may fall between about 1:1 and 4:1, for example between about 1:1 and 3:1, or between about 1.5:1 and 3:1, or between about 1.5:1 and 2.5:1, or between about 2:1 and 2.5:1. In a particular example the atomic ratio of Ni:(W+Sn) is between about 2:1 and 3:1. The atomic ratio of Ni:(W+Sn) relates to the ratio of (i) nickel atoms in the material to (ii) the sum of the number of tungsten and tin atoms in the material.

The NiWSnO material may also have a particular atomic ratio of W:Sn. In certain embodiments, the atomic ratio of W:Sn is between about 1:9 and 9:1, for example between about 1:1 and 3:1, or between about 1.5:1 and 2.5:1, or between about 1.5:1 and 2:1. In some implementations, particular atomic ratios of Ni:(W+Sn) and W:Sn are used. For instance, the atomic ratio of Ni:(W+Sn) may be between about 1:1 and 3:1, where the atomic ratio of W:Sn is between about 1:1 and 3:1. In another example, the atomic ratio of Ni:(W+Sn) may be between about 1.5:1 and 2.5:1, where the atomic ratio of W:Sn is between about 1.5:1 and 2.5:1. In a further example, the atomic ratio of Ni:(W+Sn) may be between about 2:1 and 2.5:1, where the atomic ratio of W:Sn is between about 1.5:1 and 2:1.

Because anodically coloring counter electrode layer 110 contains the ions used to produce the electrochromic phenomenon in the cathodically coloring electrochromic material when the cathodically coloring electrochromic material is in the clear state, the anodically coloring counter electrode preferably has high transmittance and a neutral color when it holds significant quantities of these ions.

When charge is removed from an anodically coloring counter electrode 110. e.g., made of conventional nickel tungsten oxide (i.e., ions are transported from the counter electrode 110 to the electrochromic layer 106), the counter electrode layer will turn from a (more or less) transparent state to a brown tinted state. Similarly, when charge is removed from an anodically coloring counter electrode 110 made of NiWSnO, the counter electrode layer will turn from a transparent state to a brown tinted state. However, the transparent state of a NiWSnO counter electrode layer may be more clear, having less color (particularly less yellow color (low b* color coordinate, for example) than the transparent state of a corresponding NiWO counter electrode layer.

The counter electrode morphology may be crystalline, amorphous, or some mixture thereof. Crystalline phases may be nanocrystalline. In some embodiments, the nickel-tungsten-tin-oxide (NiWSnO) counter electrode material is amorphous or substantially amorphous. Various substantially amorphous counter electrodes have been found to perform better, under some conditions, in comparison to their crystalline counterparts. The amorphous state of the counter electrode oxide material may be obtained through the use of certain processing conditions, described below. While not wishing to be bound to any theory or mechanism, it is believed that amorphous nickel-tungsten oxide or nickel-tungsten-tin oxide is produced by relatively low energy atoms in the sputtering process. Low energy atoms are obtained, for example, in a sputtering process with lower target powers, higher chamber pressures (i.e., lower vacuum), and/or larger source to substrate distances. Amorphous films are also more likely to form where there is a relatively higher fraction/concentration of heavy atoms (e.g., W). Under the described process conditions films with better stability under UV/heat exposure are produced. Substantially amorphous materials may have some crystalline, typically but not necessarily nanocrystalline, material dispersed in the amorphous matrix. The grain size and amounts of such crystalline materials are described in more detail below.

In some embodiments, the counter electrode morphology may include microcrystalline, nanocrystalline and/or amorphous phases. For example, the counter electrode may be, e.g., a material with an amorphous matrix having nanocrystals distributed throughout. In certain embodiments, the nanocrystals constitute about 50% or less of the counter electrode material, about 40% or less of the counter electrode material, about 30% or less of the counter electrode material, about 20% or less of the counter electrode material or about 10% or less of the counter electrode material (by weight or by volume depending on the embodiment). In certain embodiments, the nanocrystals have a maximum diameter of less than about 50 nm, in some cases less than about 25 nm, less than about 10 nm, or less than about 5 nm. In some cases, the nanocrystals have a mean diameter of about 50 nm or less, or about 10 nm or less, or about 5 nm or less (e.g., about 1-10 nm). In certain embodiments, it is desirable to have a nanocrystal size distribution where at least about 50% of the nanocrystals have a diameter within 1 standard deviation of the mean nanocrystal diameter, for example where at least about 75% of the nanocrystals have a diameter within 1 standard deviation of the mean nanocrystal diameter or where at least about 90% of the nanocrystals have a diameter within 1 standard deviation of the mean nanocrystal diameter. It has been found that counter electrodes that include an amorphous matrix tend to operate more efficiently compared to counter electrodes that are relatively more crystalline. In certain embodiments, the additive may form a host matrix in which domains of the base anodically coloring material may be found.

In various cases, the host matrix is substantially amorphous. In certain embodiments, the only crystalline structures in the counter electrode are formed from the base anodically coloring electrochromic material, in, e.g., oxide form. As mentioned, the additives may contribute to forming an amorphous host matrix that is not substantially crystalline, but which incorporates domains (e.g., nanocrystals in some cases) of the base anodically coloring electrochromic material. In other embodiments, the additive and the anodically coloring base material together form a chemical compound with covalent and/or ionic bonding. The compound may be crystalline, amorphous, or a combination thereof. In other embodiments, the anodically coloring base material forms a host matrix in which domains of the additive exist as discrete phases or pockets. For example certain embodiments include an amorphous counter electrode having an amorphous matrix of a first material, with a second material, also amorphous, distributed throughout the first material in pockets, for example, pockets of the diameters described herein for crystalline materials distributed throughout an amorphous matrix.

In some embodiments, the thickness of the counter electrode is about 50 nm about 650 nm. In some embodiments, the thickness of the counter electrode is about 100 nm to about 400 nm, sometimes in the range of about 150 nm to 300 nm, or between about 200 nm to 300 nm. The thickness of the counter electrode layer 110 is also substantially uniform. In one embodiment, a substantially uniform counter electrode layer varies only about ±10% in each of the aforementioned thickness ranges. In another embodiment, a substantially uniform counter electrode layer varies only about ±5% in each of the aforementioned thickness ranges. In another embodiment, a substantially uniform counter electrode layer varies only about ±3% in each of the aforementioned thickness ranges.

The amount of ions held in the counter electrode layer during the clear state (and correspondingly in the electrochromic layer during the tinted state) and available to drive the electrochromic transition depends on the composition of the layers as well as the thickness of the layers and the fabrication method. Both the electrochromic layer and the counter electrode layer are capable of supporting available charge (in the form of lithium ions and electrons) in the neighborhood of several tens of millicoulombs per square centimeter of layer surface area. The charge capacity of an electrochromic film is the amount of charge that can be loaded and unloaded reversibly per unit area and unit thickness of the film by applying an external voltage or potential. In one embodiment, the $WO_3$ layer has a charge capacity of between about 30 and about 150 $mC/cm^2$/micron. In another embodiment, the $WO_3$ layer has a charge capacity of between about 50 and about 100 $mC/cm^2$/micron. In one embodiment, the NiWSnO layer has a charge capacity of between about 75 and about 200 $mC/cm^2$/micron. In another embodiment, the NiWSnO layer has a charge capacity of between about 100 and about 150 $mC/cm^2$/micron.

In between electrochromic layer 106 and counter electrode layer 110, there is often an ion conducting layer 108. Ion conducting layer 108 serves as a medium through which ions are transported (in the manner of an electrolyte) when the electrochromic device transforms between the clear state and the tinted state. Preferably, ion conducting layer 108 is highly conductive to the relevant ions for the electrochromic and the counter electrode layers, but has sufficiently low electron conductivity that negligible electron transfer takes place during normal operation. A thin ion conducting layer (also sometimes referred to as an ion conductor layer) with high ionic conductivity permits fast ion conduction and hence fast switching for high performance electrochromic devices. In certain embodiments, the ion conducting layer 108 is inorganic and/or solid. When fabricated from a material and in a manner that produces relatively few defects, the ion conductor layer can be made very thin to produce a high performance device. In various implementations, the ion conductor material has an ionic conductivity of between about $10^8$ Siemens/cm or ohm$^{-1}$ cm$^{-1}$ and about $10^9$ Siemens/cm or ohm$^{-1}$ cm$^{-1}$ and aelectronic resistance of about $10^{11}$ ohms-cm.

In other embodiments, the ion conductor layer may be omitted. In such embodiments, no separate ion conductor material is deposited when forming an electrochromic stack for an electrochromic device. Instead, in these embodiments the cathodically coloring electrochromic material may be deposited in direct physical contact with the anodically coloring counter electrode material. One or both of the anodically coloring and cathodically coloring materials may be deposited to include a portion that is oxygen rich compared to the remaining portion of the material. Typically, the oxygen rich portion is in contact with the other type of layer. For instance, an electrochromic stack may include an anodically coloring material in contact with a cathodically coloring material, where the cathodically coloring material includes an oxygen-rich portion in direct physical contact with the anodically coloring material. In another example, an electrochromic stack includes an anodically coloring material in contact with a cathodically coloring material, where the anodically coloring material includes an oxygen-rich portion in direct physical contact with the cathodically coloring material. In a further example, both the anodically coloring material and the cathodically coloring material include an oxygen-rich portion, where the oxygen-rich portion of the cathodically coloring material is in direct physical contact with the oxygen-rich portion of the anodically coloring material.

The oxygen-rich portions of these layers may be provided as distinct sub-layers (e.g., a cathodically or anodically coloring material includes an oxygen-rich sublayer and a less-oxygen-rich sublayer). The oxygen-rich portion of the layers may also be provided in a graded layer (e.g., the cathodically or anodically coloring material may include a gradient in oxygen concentration, the gradient being in a direction normal to surface of the layers). Embodiments where the ion conductor layer is omitted and the anodically coloring counter electrode material is in direct contact with the cathodically coloring electrochromic material are further discussed in the following U.S. Patents, each of which is herein incorporated by reference in its entirety: U.S. Pat. Nos. 8,300,298, and 8,764,950.

Returning to the embodiment of FIG. 1, examples of suitable materials for the lithium ion conductor layer include lithium silicate, lithium aluminum silicate, lithium oxide, lithium tungstate, lithium aluminum borate, lithium borate, lithium zirconium silicate, lithium niobate, lithium borosilicate, lithium phosphosilicate, lithium nitride, lithium oxynitride, lithium aluminum fluoride, lithium phosphorus oxynitride (LiPON), lithium lanthanum titanate (LLT), lithium tantalum oxide, lithium zirconium oxide, lithium silicon carbon oxynitride (LiSiCON), lithium titanium phosphate, lithium germanium vanadium oxide, lithium zinc germanium oxide, and other ceramic materials that allow lithium ions to pass through them while having a high electrical resistance (blocking electron movement therethrough). Any material, however, may be used for the ion conducting layer 108 provided it can be fabricated with low defectivity and it allows for the passage of ions between the counter electrode layer 110 to the electrochromic layer 106 while substantially preventing the passage of electrons.

In certain embodiments, the ion conducting layer is crystalline, amorphous, or a mixture thereof. Typically, the ion conducting layer is amorphous. In another embodiment, the ion conducting layer is nanocrystalline. In another embodiment, the ion conducting layer is a mixed amorphous and crystalline phase, where the crystalline phase is nanocrystalline.

Ions transported across the ion conducting layer between the electrochromic layer and the counter electrode layer serve to effect a color change in the electrochromic layer (i.e., change the electrochromic device from the clear state to the tinted state) when they reside in the electrochromic layer. For devices having anodically coloring counter electrode layers, the absence of these ions induces color in the counter electrode layer. Depending on the choice of materials for the electrochromic device stack, such ions include lithium ions ($Li^+$) and hydrogen ions ($H^+$) (i.e., protons). As mentioned above, other ions may be employed in certain embodiments. These include deuterium ions ($D^+$), sodium ions ($Na^+$), potassium ions ($K^-$), calcium ions ($Ca^{++}$), barium ions ($Ba^{++}$), strontium ions ($Sr^{++}$), and magnesium ions ($Mg^{++}$). In certain embodiments, hydrogen ions are not used because side reactions during operation of the device cause recombination to hydrogen gas which may escape the device and degrade performance. Thus, ions that do not have this issue, for example lithium ions, may be used.

The electrochromic device 100 may include one or more additional layers (not shown) such as one or more passive layers. Passive layers used to improve certain optical properties may be included in electrochromic device 100. Passive layers for providing moisture or scratch resistance may also be included in the electrochromic device 100. For example, the conductive layers may be treated with anti-reflective or protective oxide or nitride layers. Other passive layers may serve to hermetically seal the electrochromic device 100.

Electrochromic materials may contain blind charge. The blind charge in an electrochromic material is the charge (e.g., negative charge in the cases of tungsten oxide electrochromic material) that exists in the material as fabricated, absent compensation by oppositely charged ions or other charge carriers. With tungsten oxide, for example, the magnitude of the blind charge depends upon the excess oxygen concentration during sputtering of the tungsten oxide. Functionally, blind charge must be compensated before the ions employed to transform the electrochromic material can effectively change an optical property of the electrochromic material. Without prior compensation of the blind charge, ions supplied to an electrochromic material will irreversibly incorporate in the material and have no effect on the optical state of the material. Thus, an electrochromic device is typically provided with ions, such as lithium ions or protons, in an amount sufficient both to compensate the blind charge and to provide a supply of ions for reversibly switching the electrochromic material between two optical states. In many known electrochromic devices, charge is lost during the first electrochemical cycle in compensating blind charge.

In some embodiments, lithium is present in the electrochromic stack 120 in an amount sufficient to compensate the blind charge in the electrochromic layer 106 and then an additional amount of about 1.5 to 2.5 times the amount used to compensate the blind charge (by mass) in the stack (initially in the counter electrode layer 110 for example). That is, there is about 1.5 to 2.5 times the amount of lithium needed to compensate the blind charge that is provided for reversible cycling between the electrochromic layer 106 and the counter electrode layer 110 in the electrochromic stack 120. In some embodiments, there are enough lithium in the electrochromic stack 120 to compensate the blind charge in the electrochromic layer 106 and then about two times this amount (by mass) in the counter electrode layer 110 or elsewhere in the stack.

In some embodiments, electrochromic glass is integrated into an insulating glass unit (IGU). An insulating glass unit consists of multiple glass panes assembled into a unit, generally with the intention of maximizing the thermal insulating properties of a gas contained in the space formed by the unit while at the same time providing clear vision through the unit. Insulating glass units incorporating electrochromic glass would be similar to insulating glass units currently known in the art, except for electrical leads for connecting the electrochromic glass to voltage source. Due to the higher temperatures (due to absorption of radiant energy by an electrochromic glass) that electrochromic insulating glass units may experience, more robust sealants than those used in conventional insulating glass units may be necessary. For example, stainless steel spacer bars, high temperature polyisobutylene (PIB), new secondary sealants, foil coated PIB tape for spacer bar seams, and the like.

Method of Fabricating Electrochromic Windows

Deposition of the Electrochromic Stack

As mentioned in the summary above, one aspect of the embodiments herein is a method of fabricating an electrochromic window. In a broad sense, the method includes sequentially depositing on a substrate (i) a cathodically coloring electrochromic layer, (ii) an optional ion conducting layer, and (iii) an anodically coloring counter electrode layer to form a stack. The sequential deposition employs a single integrated deposition system having a controlled ambient environment in which the pressure, temperature, and/or gas composition are controlled independently of an external environment outside of the integrated deposition system, and the substrate does not leave the integrated deposition system at any time during the sequential deposition of the electrochromic layer, the ion conducting layer, and the counter electrode layer. (Examples of integrated deposition systems which maintain controlled ambient environments are described in more detail below in relation to FIGS. 8A-E.) The gas composition may be characterized by the partial pressures of the various components in the controlled ambient environment. The controlled ambient environment also may be characterized in terms of the number of particles or particle densities. In certain embodiments, the controlled ambient environment contains fewer than 350 particles (of size 0.1 micrometers or larger) per $m^3$. In certain embodiments, the controlled ambient environment meets the requirements of a class 100 clean room (US FED STD 209E). In certain embodiments, the controlled ambient environment meets the requirements of a class 10 clean room (US FED STD 209E). The substrate may enter and/or leave the controlled ambient environment in a clean room meeting class 1000, class 100, or even class 10 requirements.

Typically, but not necessarily, this method of fabrication is integrated into a multistep process for making an electrochromic window using architectural glass as the substrate. For convenience, the following description contemplates the method and its various embodiments in the context of a multistep process for fabricating an electrochromic window, but methods herein are not so limited. Electrochromic mirrors and other devices may be fabricated using some or all of the operations and approaches described herein.

Figure 2:
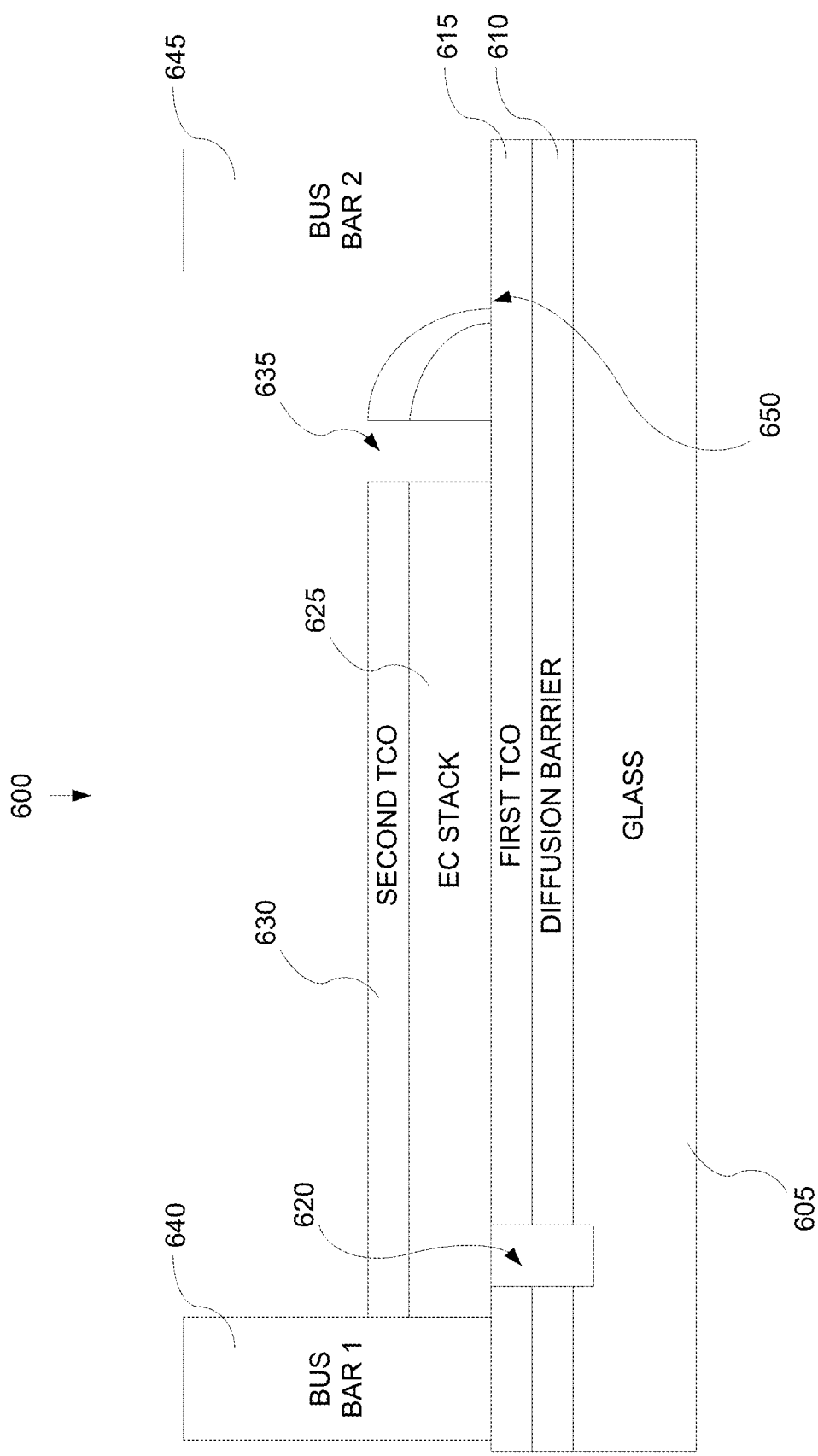
FIG. 2 depicts a cross-sectional representation of an electrochromic window device in accord with the multistep process description provided in relation to FIG. 4.
Figure 3:
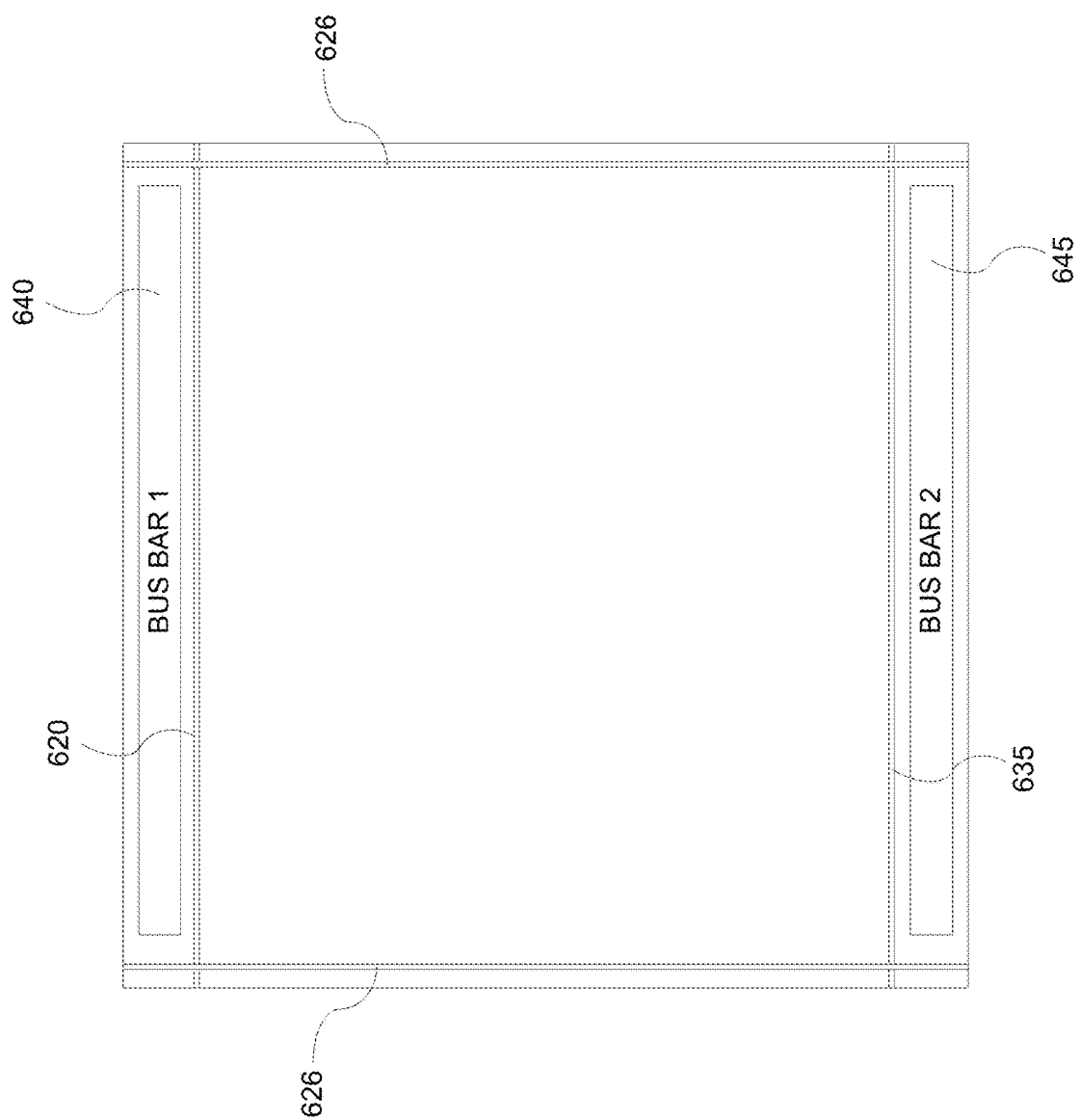
FIG. 3 depicts a top view of an electrochromic device showing location of trenches cut into the device.
Figure 4:
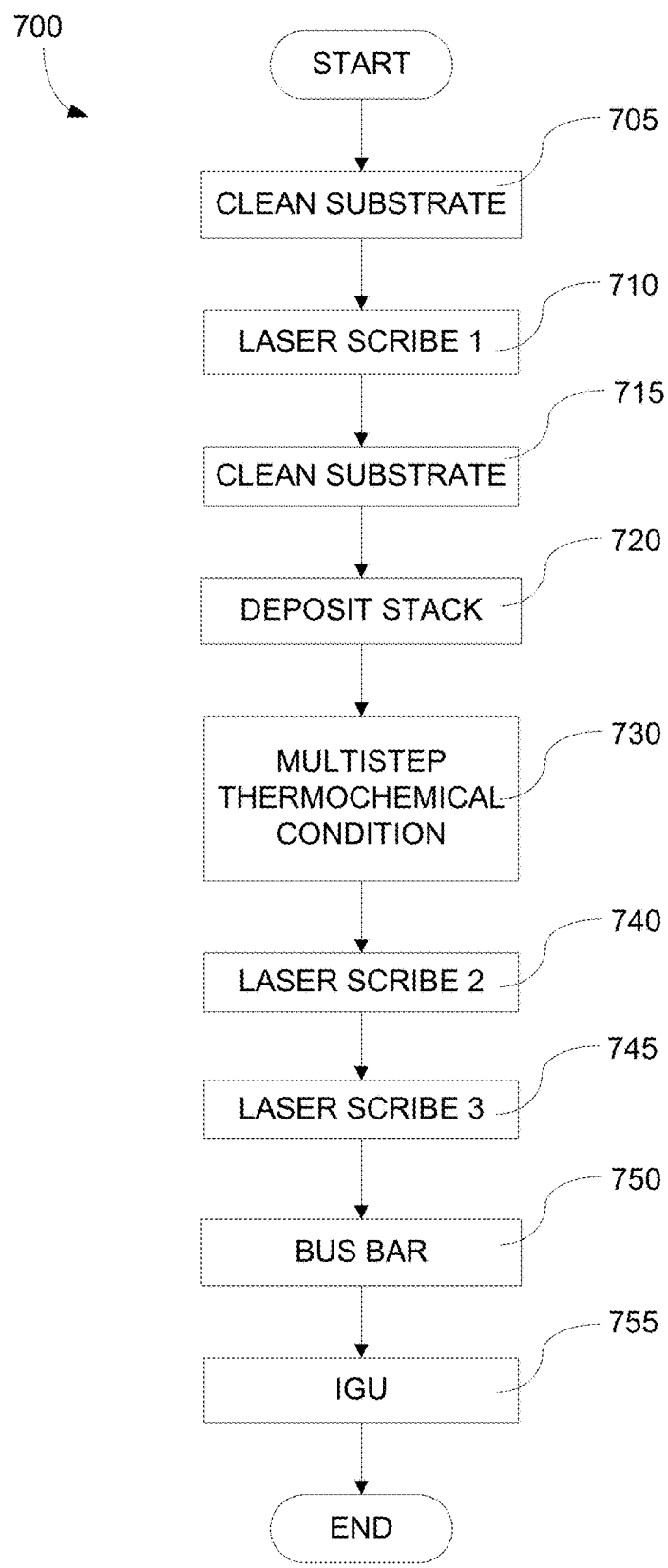
FIG. 4 depicts a process flow describing a method of fabricating an electrochromic window.
Figure 5:
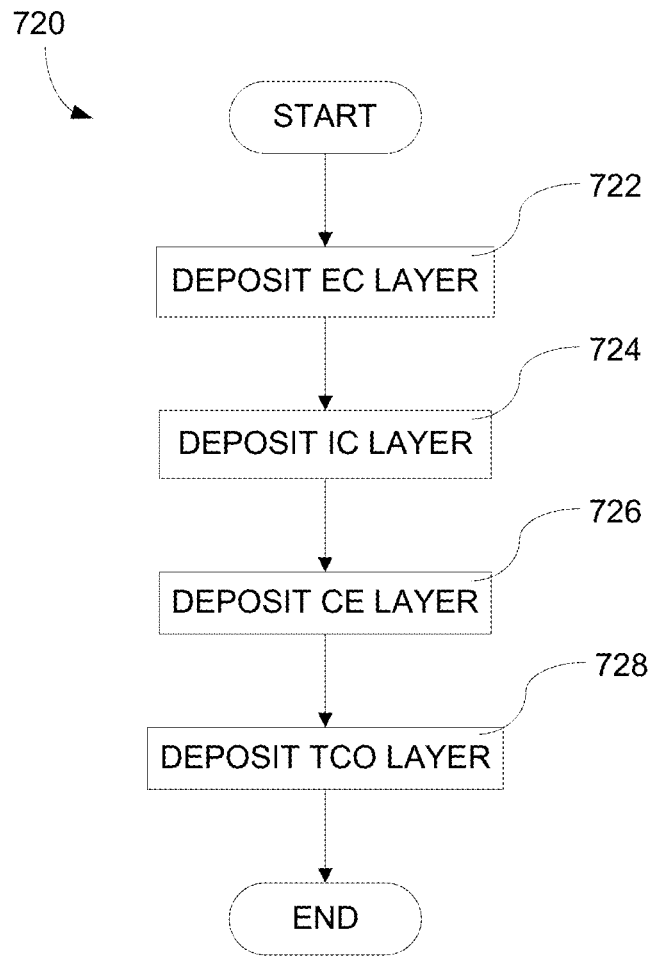
FIGS. 5-7 depict methods of fabricating an electrochromic stack which is part of an electrochromic device according to certain embodiments.
Figure 6:
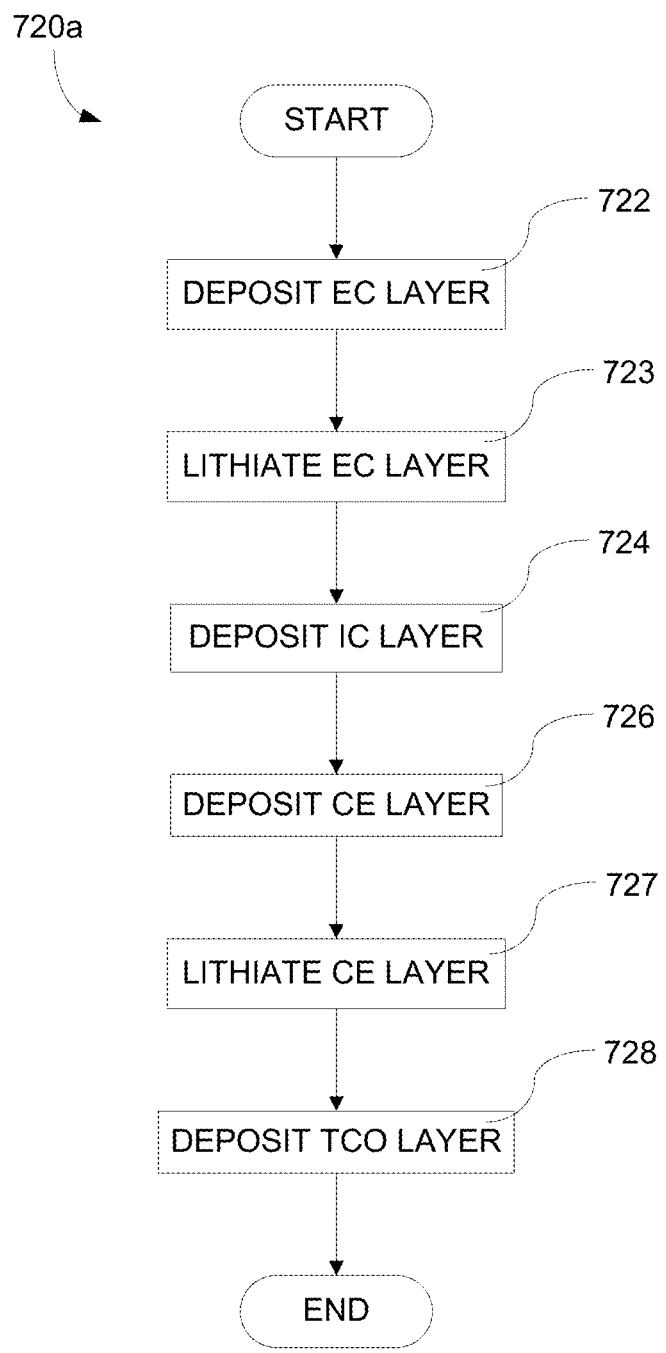
Figure 7:
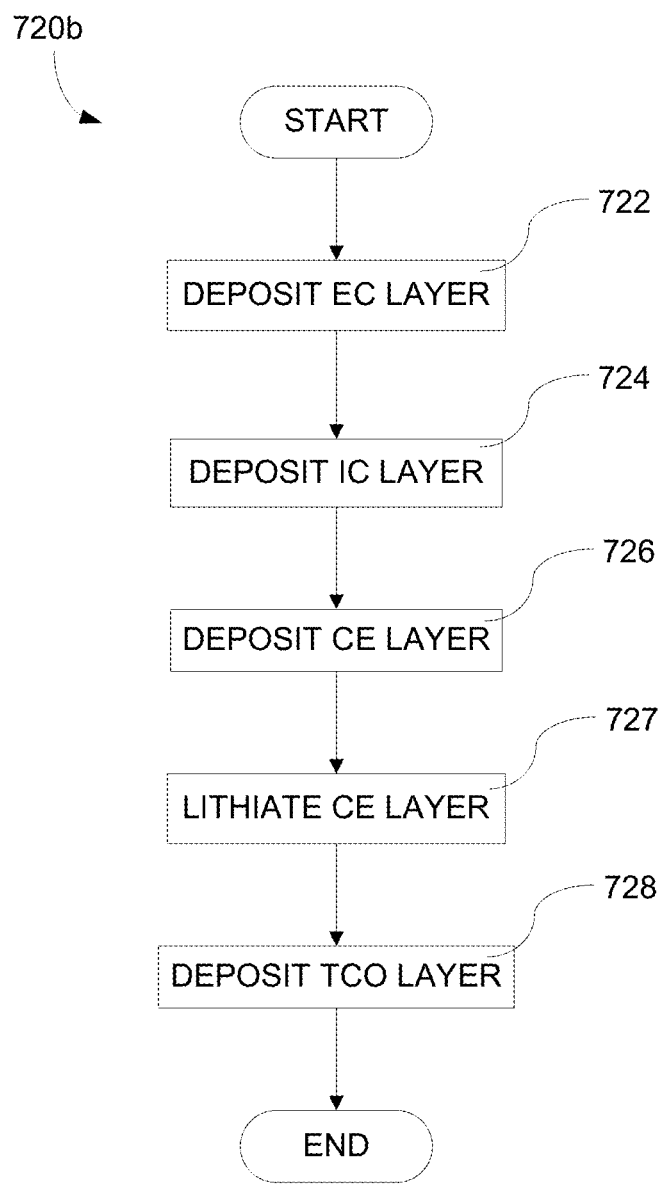

FIG. 2 is a cross-sectional representation of an electrochromic window device, 600, in accord with a multistep process such as that described in relation to FIG. 4. FIG. 4 depicts a process flow describing a method, 700, of fabricating an electrochromic window which incorporates electrochromic device 600. FIG. 3 is a top view of device 600 showing the location of trenches cut into the device. Thus, FIGS. 2-B and 4 will be described together. One aspect of the description is an electrochromic window including device 600 and another aspect of the description is a method, 700, of fabricating an electrochromic window which includes device 600. Included in the following description are descriptions of FIGS. 5-7. FIGS. 5-7 depict specific methods of fabricating an electrochromic stack which is part of device 600.

FIG. 2 shows a specific example of an electrochromic device, 600, which is fabricated starting with a substrate made of glass 605 which optionally has a diffusion barrier 610 coating and a first transparent conducting oxide (TCO) coating 615 on the diffusion barrier. Method 700 employs a substrate that is, for example, float glass with sodium diffusion barrier and antireflective layers followed by a transparent conductive layer, for example a transparent conductive oxide 615. As mentioned above, substrates suitable include glasses sold under the trademarks TEC Glass® by Pilkington of Toledo, Ohio, and SUNGATE® 300 and SUNGATE® 500 by PPG Industries, of Pittsburgh, Pa. The first TCO layer 615 is the first of two conductive layers used to form the electrodes of electrochromic device 600 fabricated on the substrate.

Method 700 begins with a cleaning process, 705, where the substrate is cleaned to prepare it for subsequent processing. One example of a cleaning process and apparatus suitable in various embodiments is Lisec™ (a trade name for a glass washing apparatus and process available from (LISEC Maschinenbau Gmbh of Seitenstetten, Austria).

Cleaning the substrate may include mechanical scrubbing as well as sonication conditioning to remove unwanted particulates. As mentioned, particulates may lead to cosmetic flaws as well as local shorting within the device.

Once the substrate is cleaned, a first laser scribe process, 710, is performed in order to remove a line of the first TCO layer on the substrate. In one embodiment, the resulting trench ablates through both the TCO and the diffusion barrier (although in some cases the diffusion barrier is not substantially penetrated). FIG. 2 depicts this first laser scribe trench, 620. A trench is scribed in the substrate across the entire length of one side of the substrate in order to isolate an area of the TCO, near one edge of the substrate, which will ultimately make contact with a first bus bar, 640, used to provide current to a second TCO layer, 630, which is deposited on top of electrochromic (EC) stack 625 (which includes the electrochromic, ion conducting and counter electrode layers as described above).

FIG. 3 shows schematically (not to scale) the location of trench 620. In the depicted embodiment, the non-isolated (main) portion of the first TCO layer, on the diffusion barrier, ultimately makes contact with a second bus bar, 645. Isolation trench 620 may be needed because, in certain embodiments, the method of attaching the first bus bar to the device includes pressing it through the device stack layers after they are laid down (both on the isolated portion of the first TCO layer and the main portion of the first TCO layer). Those of skill in the art will recognize that other arrangements are possible for providing current to the electrodes, in this case TCO layers, in the electrochromic device. The TCO area isolated by the first laser scribe is typically an area along one edge of the substrate that will ultimately, along with the bus bars, be hidden when incorporated into the integrated glass unit (IGU) and/or window pane, frame or curtain wall. The laser or lasers used for the first laser scribe are typically, but not necessarily, pulse-type lasers, for example diode-pumped solid state lasers. For example, the laser scribes can be performed using a suitable laser from IPG Photonics (of Oxford Massachusetts), or from Ekspla (of Vilnius Lithuania).

After the first laser scribe 710, the substrate is cleaned again (operation 715), typically but not necessarily, using cleaning methods described above. This second cleaning process is performed to remove any debris caused by the first laser scribe. Once cleaning operation 715 is complete, the substrate is ready for deposition of EC stack 625. This is depicted in process flow 700 as process 720. As mentioned above, the method includes sequentially depositing on a substrate (i) a cathodically coloring EC layer, (ii) an optional IC layer, and (iii) an anodically coloring CE layer (e.g., NiWSnO in various embodiments) to form a stack in which the IC layer separates the EC layer and the CE layer using a single integrated deposition system having a controlled ambient environment in which the pressure and/or gas composition are controlled independently of an external environment outside of the integrated deposition system, and the substrate does not leave the integrated deposition system at any time during the sequential deposition of the EC layer, the IC layer, and the CE layer.

In one embodiment, each of the sequentially deposited layers is physical vapor deposited. In general the layers of the electrochromic device may be deposited by various techniques including physical vapor deposition, chemical vapor deposition, plasma enhanced chemical vapor deposition, and atomic layer deposition, to name a few. The term physical vapor deposition as used herein includes the full range of art understood PVD techniques including sputtering, evaporation, ablation, and the like. FIG. 5 depicts one embodiment of process 720. First the cathodically coloring EC layer is deposited on the substrate, process 722, then the IC layer is deposited, process 724 (as noted above, in certain embodiments the IC layer, and therefore process 724, are omitted), then the anodically coloring CE layer, process 726. The reverse order of deposition is also an embodiment, that is, where the CE layer is deposited first, then the optional IC layer and then the EC layer. In one embodiment, each of the electrochromic layer, the optional ion conducting layer, and the counter electrode layer is a solid phase layer. In another embodiment, each of the electrochromic layer, the optional ion conducting layer, and the counter electrode layer includes only inorganic material.

It should be understood that while certain embodiments are described in terms of a counter electrode layer, an ion conductor layer, and an electrochromic layer, any one or more of these layers may be composed of one or more sub-layers, which may have distinct compositions, sizes, morphologies, charge densities, optical properties, etc. Further any one or more of the device layers may have a graded composition or a graded morphology in which the composition or morphology, respectively, changes over at least a portion of the thickness of the layer. In one example, the concentration of oxygen, a dopant, or charge carrier varies within a given layer, at least as the layer is fabricated. In another example, the morphology of a layer varies from crystalline to amorphous. Such graded composition or morphology may be chosen to impact the functional properties of the device. In some cases, additional layers may be added to the stack. In one example a heat spreader layer is interposed between one or both TCO layers and the EC stack.

Also, as described above, the electrochromic devices of certain embodiments utilize ion movement between the electrochromic layer and the counter electrode layer via an ion conducting layer. In some embodiments these ions (or neutral precursors thereof) are introduced to the stack as one or more layers (as described below in more detail in relation to FIGS. 6 and 7) that eventually intercalate into the stack. In some embodiments these ions are introduced into the stack concurrently with one or more of the electrochromic layer, the ion conducting layer, and the counter electrode layer. In one embodiment, where lithium ions are used, lithium is, e.g., sputtered along with the material used to make the one or more of the stack layers or sputtered as part of a material that includes lithium (e.g., by a method employing lithium nickel tungsten tin oxide). In one embodiment, the IC layer is deposited via sputtering a lithium silicon aluminum oxide target. In another embodiment, the Li is cosputtered along with silicon aluminum in order to achieve the desired film.

Referring again to process 722 in FIG. 5, in one embodiment, depositing the electrochromic layer comprises depositing $WO_x$. In one embodiment, depositing the electrochromic layer includes sputtering tungsten from a tungsten containing target. In one such embodiment, a metallic tungsten (or tungsten alloy) target is used. In another embodiment (which may also employ a metallic tungsten target) the sputter gas is an inert gas (e.g., argon or xenon) with some oxygen containing gas (e.g., molecular or atomic oxygen) present. This is part of the controlled ambient environment that may be present in a deposition chamber or a station within a larger chamber.

In one embodiment, in order to normalize the rate of deposition of tungsten, multiple targets are used so as to obviate the need for inappropriately high power (or other inappropriate adjustment to desired process conditions) to increase deposition rate. The distance between the target and the substrate may also be important. In one embodiment, the distance between the target (cathode or source) to the substrate surface is between about 35 mm and about 150 mm; in another embodiment between about 45 mm and about 130 mm; and in another embodiment between about 70 mm and about 100 mm.

It should be understood that while deposition of the EC layer is described in terms of sputtering from a target, other deposition techniques are employed in some embodiments. For example, chemical vapor deposition, atomic layer deposition, and the like may be employed. Each of these techniques, along with PVD, has its own form of material source as is known to those of skill in the art.

Referring again to FIG. 5, operation 724, once the EC layer is deposited, the optional IC layer may be deposited.

Referring again to FIG. 5, operation 726, after the IC layer is deposited, the CE layer is deposited. In one embodiment, depositing the counter electrode layer includes depositing a layer of nickel-tungsten-tin-oxide (NiWSnO). In a specific embodiment, depositing the counter electrode layer includes sputtering a target including about 30% (by weight) to about 70% of tungsten in nickel in an oxygen containing environment to produce a layer of nickel tungsten tin oxide (the tin being provided by the tungsten in nickel target at an appropriate composition, or by another target, or through another source such as an evaporated tin source). In another embodiment the target is between about 40% and about 60% tungsten in nickel, in another embodiment between about 45% and about 55% tungsten in nickel, and in yet another embodiment about 51% tungsten in nickel.

In certain embodiments where the anodically coloring counter electrode layer includes NiWSnO, many deposition targets or combinations of targets may be used. For instance, individual metal targets of nickel, tungsten, and tin can be used. In other cases at least one of the targets includes an alloy. For instance, an alloy target of nickel-tungsten can be used together with a metal tin target. In another case, an alloy target of nickel-tin can be used together with a metal tungsten target. In a further case, an alloy of tungsten-tin can be used together with a metal nickel target. In yet a further case, an alloy target containing a nickel-tungsten-tin material may be used. Moreover, any of the listed targets can be provided as an oxide. Oftentimes, sputtering occurs in the presence of oxygen, and such oxygen is incorporated into the material. Sputter targets containing oxygen may be used alternatively or in addition to an oxygen-containing sputtering atmosphere.

The sputtering target(s) for forming the anodically coloring counter electrode material may have compositions that permit the counter electrode to be formed at any of the compositions described herein. In one example where a single sputter target is used, the sputter target may have a composition that matches the composition of any of the NiWSnO materials disclosed herein. In other examples a combination of sputter targets are used, and the composition of the combined targets allows for deposition at any of the NiWSnO materials disclosed herein. Further, the sputter targets may be arranged in any way that permits the material to be deposited as desired, as discussed further below. Metal targets are generally sputtered in oxygen with or without an inert gas such as argon. Metal oxide targets are typically sputtered in inert gas alone. One may use Ni, W and Sn metal targets, a NiW target with a Sn target, NiWO target with tin oxide target, etc. Various combinations are possible. As another example, nickel tungsten tin alloy target or a NiWSnO target of the appropriate composition may be used if a single target is desired.

In one embodiment, the gas composition used when forming the CE contains between about 30% and about 100% oxygen, in another embodiment between about 80% and about 100% oxygen, in yet another embodiment between about 95% and about 100% oxygen, in another embodiment about 100% oxygen. In one embodiment, the power density used to sputter the CE target is between about 2 Watts/cm$^2$ and about 50 Watts/cm$^2$ (determined based on the power applied divided by the surface area of the target); in another embodiment between about 5 Watts/cm$^2$ and about 20 Watts/cm$^2$; and in yet another embodiment between about 8 Watts/cm$^2$ and about 10 Watts/cm$^2$, in another embodiment about 8 Watts/cm$^2$. In some embodiments, the power delivered to effect sputtering is provided via direct current (DC). In other embodiments, pulsed DC/AC reactive sputtering is used. In one embodiment, where pulsed DC/AC reactive sputtering is used, the frequency is between about 20 kHz and about 400 kHz, in another embodiment between about 20 kHz and about 50 kHz, in yet another embodiment between about 40 kHz and about 50 kHz, in another embodiment about 40 kHz. The pressure in the deposition station or chamber, in one embodiment, is between about 1 and about 50 mTorr, in another embodiment between about 20 and about 40 mTorr, in another embodiment between about 25 and about 35 mTorr, in another embodiment about 30 mTorr.

In some cases, a nickel tungsten oxide NiWO ceramic target is sputtered with, e.g., argon and oxygen. In one embodiment, the NiWO is between about 15% (atomic) Ni and about 60% Ni; between about 10% W and about 40% W; and between about 30% O and about 75% O. In another embodiment, the NiWO is between about 30% (atomic) Ni and about 45% Ni; between about 10% W and about 25% W; and between about 35% O and about 50% O. In one embodiment, the NiWO is about 42% (atomic) Ni, about 14% W, and about 44% O. NiWO targets may be used in combination with tin or tin oxide targets in some cases. In another embodiment, depositing the counter electrode layer includes depositing the counter electrode layer to a thickness of between about 150 and 350 nm; in yet another embodiment between about 200 and about 250 nm thick. The above conditions may be used in any combination with one another to effect deposition of a high quality NiWSnO layer.

The sputtering process for forming the CE layer may utilize one or more sputter targets. In one example where one sputter target is used, the target may include nickel, tungsten, and tin. In some cases the sputter target also includes oxygen. The sputter target may include a grid or other overlapping shape where different portions of the grid include the different relevant materials (e.g., certain portions of the grid may include elemental nickel, elemental tungsten, elemental tin, a nickel-tungsten alloy, a nickel-tin alloy, and/or a tungsten-tin alloy). In some cases, a sputter target may be an alloy of the relevant materials (e.g., two or more of nickel, tungsten, and tin). Where two or more sputter targets are used, each sputter target may include one of the relevant materials (e.g., elemental and/or alloy forms of nickel, tungsten, and/or tin, any of which can be provided in oxide form). The sputter targets may overlap in some cases. The sputter targets may also rotate in some embodiments. As noted, the counter electrode layer is typically an oxide material. Oxygen may be provided as a part of the sputter target and/or sputter gas. In certain cases, the sputter targets are substantially pure metals, and sputtering is done in the presence of oxygen to form the oxide.

In one embodiment, in order to normalize the rate of deposition of the CE layer, multiple targets are used so as to obviate the need for inappropriately high power (or other inappropriate adjustment to desired process conditions) to increase deposition rate. In one embodiment, the distance between the CE target (cathode or source) to the substrate surface is between about 35 mm and about 150 mm; in another embodiment between about 45 mm and about 130 mm; and in another embodiment between about 70 mm and about 100 mm.

Figure 9A:
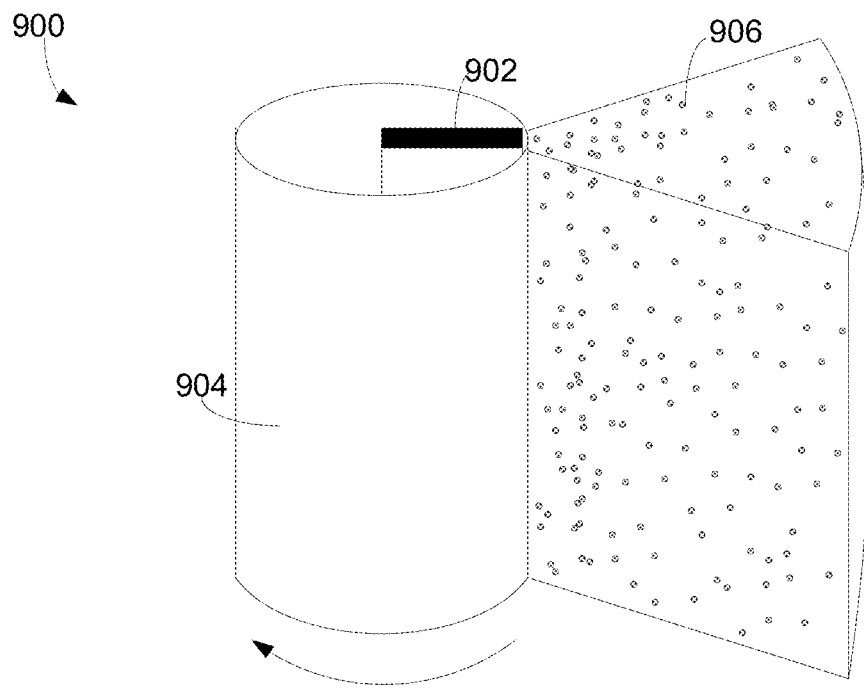
FIG. 9A illustrates a rotating sputter target according to certain embodiments.

As noted, one or more rotating targets may be used in some cases. In various cases, a rotating target may include an interior magnet. FIG. 9A presents a view of a rotating target 900. Inside the rotating target 900 is a magnet 902, which (when the target is supplied with appropriate power) causes material to sputter off of the target surface 904 in a sputter cone 906 (sputter cones are also sometimes referred to as sputter plasmas). The magnet 902 may extend along the length of the sputter target 900. In various embodiments, the magnet 902 may be oriented to extend radially outward such that the resulting sputter cone 906 emanates from the sputter target 900 in a direction normal to the target's surface 904 (the direction being measured along a central axis of the sputter cone 906, which typically corresponds to the average direction of the sputter cone 906). The sputter cone 906 may be v-shaped when viewed from above, and may extend along the height of the target 900 (or the height of the magnet 902 if not the same as the height of the target 900).

The magnet 902 inside the rotating target 900 may be fixed (i.e., though the surface 904 of the target 900 rotates, the magnet 902 within the target 900 does not rotate) such that the sputter cone 906 is also fixed. The small circles/dots depicted in the sputter cone 906 represent sputtered material that emanates from the sputter target 900. Rotating targets may be combined with other rotating targets and/or planar targets as desired.

Figure 9B:
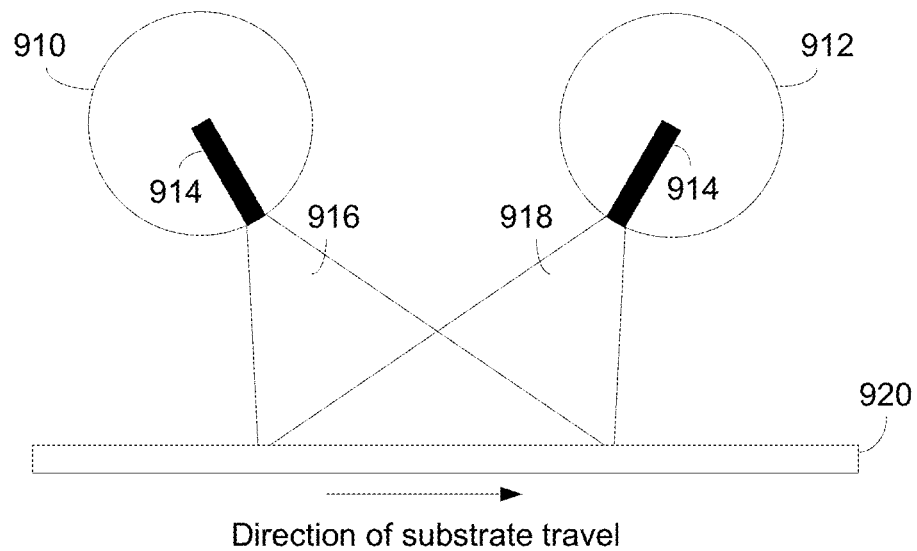
FIG. 9B shows a top-down view of two rotating sputter targets depositing material on a substrate according to certain embodiments.

In one example, two rotating targets are used to deposit a NiWSnO anodically coloring EC layer: a first target including nickel and tungsten, and a second target including tin (either or both optionally in oxide form). FIG. 9B presents a top down view of a deposition system for depositing an anodically coloring layer in this manner. The nickel tungsten target 910 and the tin target 912 each include an interior magnet 914. The magnets 914 are angled toward one another such that the sputter cones 916 and 918 from the nickel tungsten target 910 and tin target 912, respectively, overlap. FIG. 9B also shows a substrate 920 passing in front of the targets 910 and 912. As shown, the sputter cones 916 and 918 closely overlap where they impact the substrate 920. In some embodiments, the sputter cones from various sputter targets may closely overlap with one another (e.g., the non-overlapping area over which only a single sputter cone reaches when depositing on a substrate is less than about 10%, for example less than about 5% of the total area over which either sputter cone reaches). In other embodiments, the sputter cones may diverge from one another to a greater degree such that either or both of the sputter cones has a non-overlapping area that is at least about 10%, for example at least about 20%, or at least about 30%, or at least about 50%, of the total area over which either sputter cone reaches.

In a similar embodiment to the one shown in FIG. 9B, one sputter target is tungsten and the other is an alloy of nickel and tin (either or both targets optionally being in oxide form). Similarly, one sputter target may be nickel and the other may be an alloy of tungsten and tin (either or both target optionally being in oxide form). In a related embodiment, three sputter targets are used: a tin target, a nickel target, and a tungsten target (any of which can optionally be in oxide form). The sputter cones from each of the three targets may overlap by angling the magnets as appropriate. Also, shielding, gratings and/or other additional plasma shaping elements may be used to aid in creating the appropriate plasma mixture to form the NiWSnO.

Various sputter target designs, orientations, and implementations are further discussed in U.S. patent application Ser. No. 13/462,725, filed May 2, 2012, and titled "ELECTROCHROMIC DEVICES," which is herein incorporated by reference in its entirety.

The density and orientation/shape of material that sputters off of a sputter target depends on various factors including, for example, the magnetic field shape and strength, pressure, and power density used to generate the sputter plasma. The distance between adjacent targets, as well as the distance between each target and substrate, can also affect how the sputter plasmas will mix and how the resulting material is deposited on the substrate.

In certain embodiments, two different types of sputter targets are provided to deposit a single layer in an electrochromic stack: (a) primary sputter targets, which sputter material onto a substrate, and (b) secondary sputter targets, which sputter material onto the primary sputter targets. The primary and secondary sputter targets may include any combination of metal, metal alloys, and metal oxides that achieve a desired composition in a deposited layer. In one particular example, a primary sputter target includes an alloy of nickel and tungsten, and a secondary sputter target includes tin. In another example a primary sputter target includes tin and a secondary sputter target includes an alloy of nickel and tungsten. These sputter targets may be used together to deposit an anodically coloring layer of NiWSnO. Other combinations of alloys (e.g., nickel-tin, tungsten-tin) and metals (e.g., nickel, tungsten) can also be used. Any sputter target may be provided as an oxide.

Figure 10A:
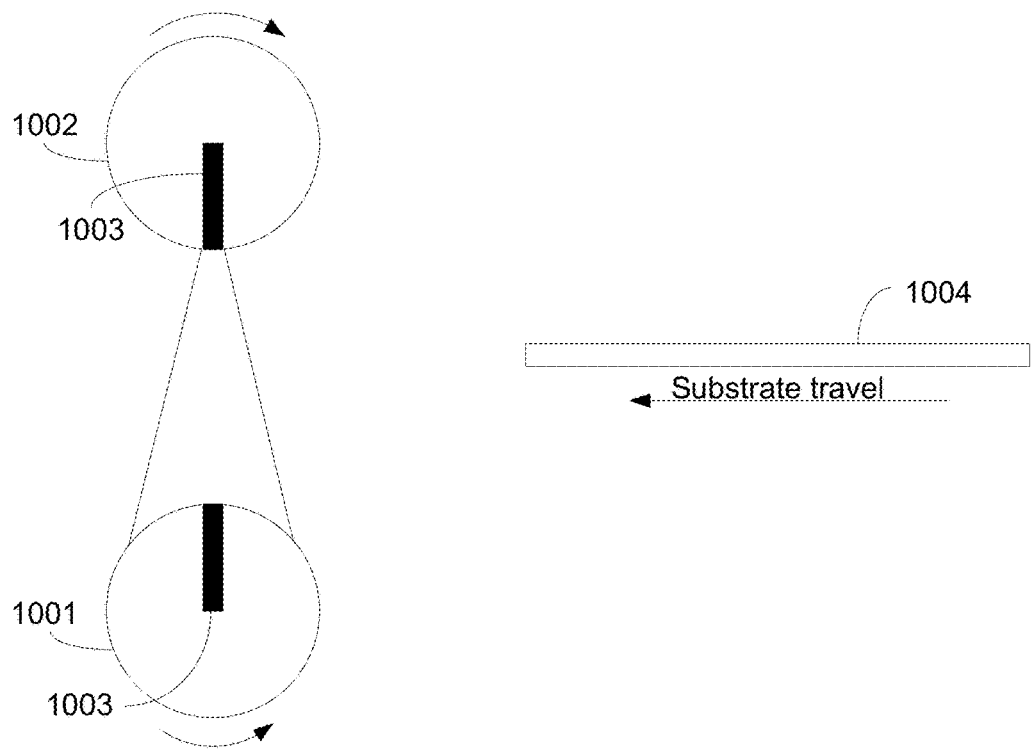
FIGS. 10A-10C relate to embodiments where a secondary sputter target is used to deposit material onto a primary sputter target, which then deposits on a substrate according to certain embodiments.
Figure 10B:
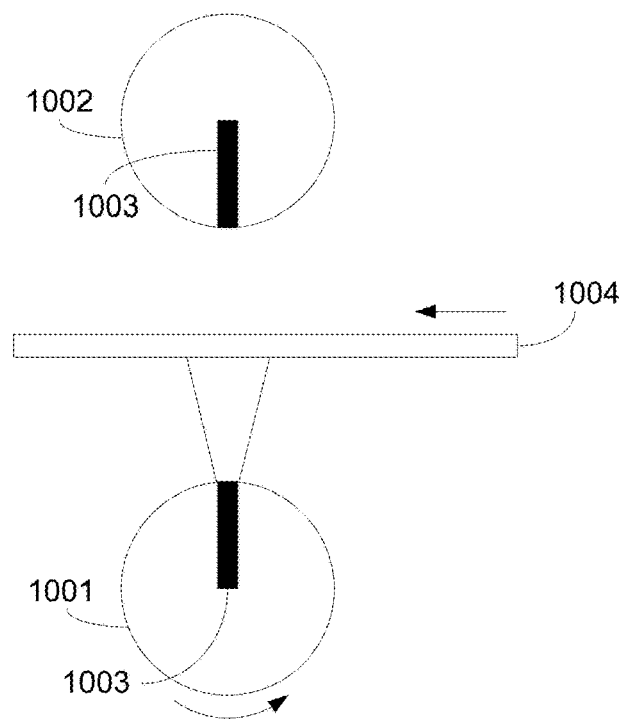

A number of different setups are possible when using both primary and secondary sputter targets. FIGS. 10A and 10B presents top-down views of one embodiment of a deposition station for depositing a NiWSnO anodically coloring counter electrode layer. Though presented in the specific context of depositing NiWSnO, the sputter target configurations discussed herein may be used to deposit any material in the electrochromic stack, provided that the targets are of appropriate compositions to deposit the desired material in the stack. A primary sputter target 1001 and a secondary sputter target 1002 are provided, each with an internal magnet 1003. Each sputter target in this example is a rotating sputter target, though planar or other shaped targets may be used as well. The targets may rotate in the same direction or in opposite directions. The secondary sputter target 1002 sputters material onto the primary sputter target 1001 when no substrate 1004 is present between the two targets, as shown in FIG. 10A. This deposits material from the secondary sputter target 1002 onto the primary sputter target 1001. Then, as the substrate 1004 moves into position between the two targets, sputtering from the secondary sputter target 1002 ceases and sputtering from the primary sputter target 1001 onto the substrate 1004 begins, as shown in FIG. 10B.

When material is sputtered off of the primary sputter target 1001 and deposited onto the substrate 1004, the deposited material includes material that originated from both the primary and secondary sputter targets 1001 and 1002, respectively. In effect, this method involves in-situ formation of an intermixed sputter target surface on the primary sputter target 1001. One advantage of this method is that a fresh coating of material from the secondary sputter target 1002 (e.g., in some cases this material is tin, tungsten, nickel, or combinations and/or alloys thereof) is periodically deposited on the surface of the primary sputter target 1001. The intermixed materials are then delivered together to the substrate 1004.

Figure 10C:
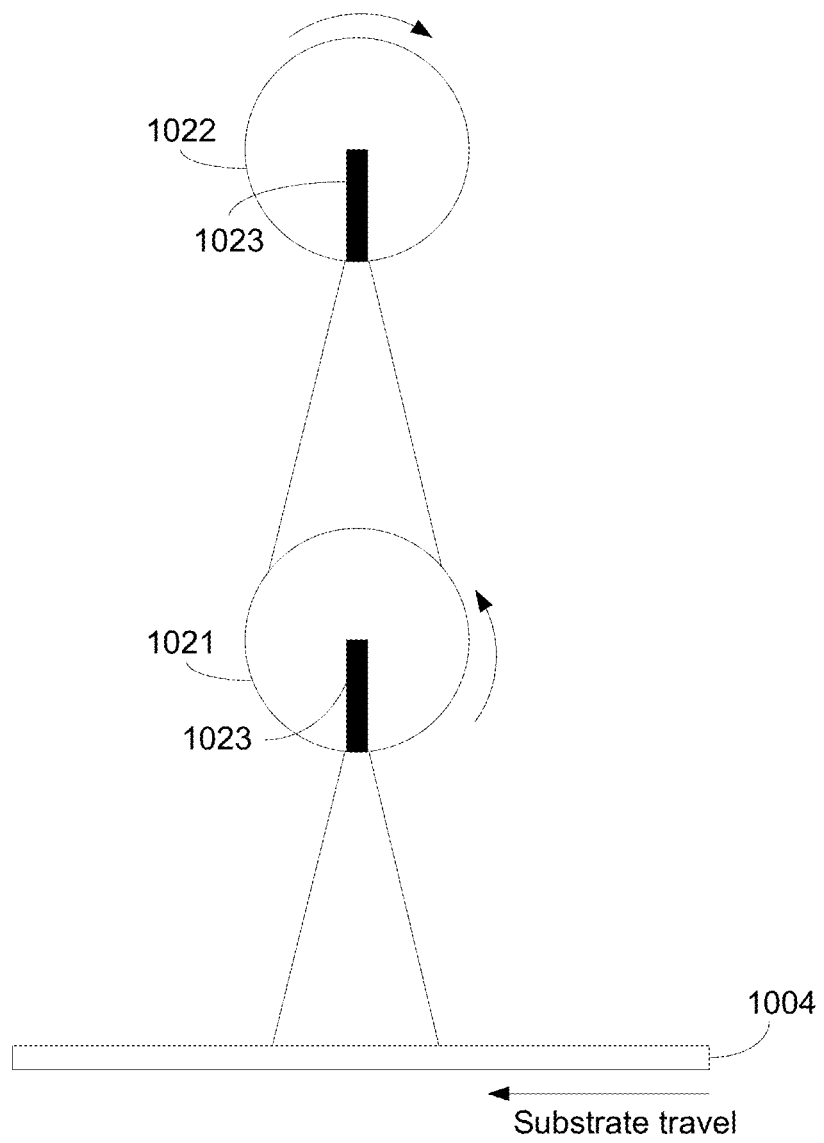

In a related embodiment shown in FIG. 10C, a secondary sputter target 1022 is positioned behind a primary sputter target 1021, and a substrate 1024 passes in front of the primary sputter target 1021 such that it does not block the line of sight between the two targets 1021 and 1022. Each of the sputter targets may include a magnet 1023. In this embodiment, there is no need to periodically stop sputtering from the secondary sputter target 1021 onto the primary sputter target 1022. Instead, such sputtering can occur continuously. Where the primary sputter target 1021 is located in between the substrate 1024 and the secondary sputter target 1022 (e.g., there is no line of sight between the secondary sputter target 1022 and the substrate 1024), the primary sputter target 1021 should rotate such that material that is deposited onto the primary sputter target 1021 can be sputtered onto the substrate 1024. There is more flexibility in the design of the secondary sputter target 1022. In a related embodiment, the secondary sputter target may be a planar or other non-rotating target. Where two rotating targets are used, the targets may rotate in the same direction or in opposite directions.

In similar embodiments, the secondary sputter target (e.g., the secondary target in FIGS. 10A-10C) may be replaced with another secondary material source. The secondary material source may provide material to the primary sputter target through means other than sputtering. In one example, the secondary material source provides evaporated material to the primary sputter target. The evaporated material may be any component of a layer being deposited. In various examples the evaporated material is an elemental metal or metal oxide. Particular examples of evaporated material include tin, tungsten, and nickel, which may be used to form a NiWSnO anodically coloring counter electrode material. In one embodiment, elemental tin is evaporated onto a primary sputter target including a mixture and/or alloy of nickel and tungsten. Tin is a particularly good evaporated material due to its relatively low melting point. Where a secondary material source provides evaporated material, the secondary material source may be provided at any location relative to the primary sputter target and substrate. In some embodiments the secondary material source is provided such that it is behind and deposits primarily on the primary sputter target, much like the setup shown in FIG. 10C.

Where both a primary and a secondary sputter target are used, the secondary sputter target may be operated at a potential that is cathodic compared to the potential of the primary sputter target (which is already cathodic). Alternatively, the targets may be operated independently. Still further, regardless of relative target potentials, neutral species ejected from the secondary target will deposit on the primary target. Neutral atoms will be part of the flux, and they will deposit on a cathodic primary target regardless of relative potentials.

Figure 11:
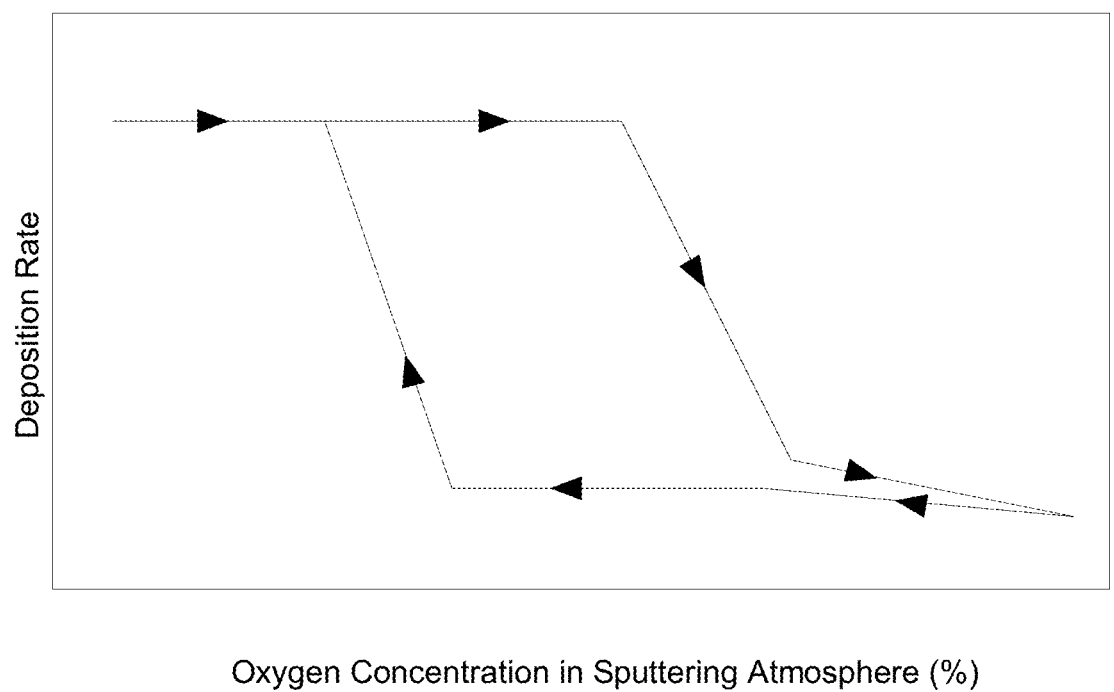
FIG. 11 illustrates a hysteresis curve for depositing various optically switchable materials.

In various embodiments, reactive sputtering may be used to deposit one or more materials in the electrochromic stack. FIG. 11 is a diagram showing the sputtering deposition rate from a sputter target as a function of oxygen concentration at a fixed power. As shown in FIG. 11, there is a strong hysteresis effect related to the oxygen concentration profile the target has been exposed to/operated under. For instance, when starting from a low oxygen concentration and increasing to a higher oxygen concentration, the deposition rate stays fairly high until the oxygen concentration reaches a point at which the sputter target forms an oxide that cannot be removed from the target sufficiently quickly. At this point the deposition rate drops down, and the sputter target essentially forms a metal oxide target. The deposition rate for an oxide target is generally much lower than the deposition rate for a metal target, all other conditions being equal. The relatively high deposition rate region in FIG. 11 corresponds to a metal deposition regime, while the relatively low deposition rate region corresponds to a metal oxide deposition regime. When the target is initially exposed to/operated under a high oxygen concentration then exposed to/operated under a relatively lower concentration, the deposition rate stays fairly low until the oxygen concentration reaches a point at which the deposition rate jumps up to a higher level. As shown in FIG. 11, the oxygen concentration at which these changes take place is different depending on whether the oxygen concentration is increasing or decreasing. The exact oxygen concentrations at which the regime changes occur can be controlled by changing the target power density and magnetic strength of the internal magnet 1003. For example, if one target is sputtering a substantially higher flux of metal atoms from the surface (due to higher power and/or magnetic strength), that target would likely stay in the metal deposition regime, compared to a target which is sputtering a very low flux of metal atoms. Such hysteresis effects can be used to advantage in a deposition process.

In certain embodiments where two or more sputter targets are used to deposit a material in the electrochromic stack, one target may be operated in the metal deposition regime and another target may be operated in the metal oxide deposition regime. By controlling the target power density, magnetic strength of the internal magnet 1003, and the atmosphere to which each target is exposed/operated under over time, it is possible to operate at both of these regimes simultaneously. In one example, a first nickel tungsten target is exposed to a relatively low concentration of oxygen and then brought to a mid-level concentration of oxygen such that it operates in the metal deposition regime. A second tin target is exposed to a relatively high concentration of oxygen and then brought to a mid-level concentration of oxygen such that it operates in the metal oxide deposition regime. The two targets can then be brought together, still exposed to the mid-level oxygen concentration, where they are used to deposit material onto a substrate under both regimes (the first target continuing to operate under the metal deposition regime and the second target continuing to operate under the metal oxide deposition regime).

The different atmosphere exposures for each target may not be needed in many cases. Other factors besides different historical oxygen exposure can result in the targets operating under the different deposition regimes. For instance, the targets may have different hysteresis curves due to the different material in the targets. As such, the targets may be able to operate under different regimes even if they are historically exposed to and operated under the same atmospheric oxygen conditions. Further, the amount of power applied to each target can significantly affect the deposition regime experienced by each target. In one example, therefore, one target is operated under a metal deposition regime and another target is operated under a metal oxide deposition regime due to the different powers applied to each target. This approach may be easier because it does not require separating the targets from one another such that they can be exposed to different oxygen concentrations. One advantage to operating the targets at different points in the hysteresis curves is that the composition of a deposited material can be closely controlled.

It should be understood that while the order of deposition operations is depicted in FIG. 5 (and implied in FIG. 2) to be first EC layer, second IC layer, and finally CE layer, the order can be reversed in various embodiments. In other words, when as described herein "sequential" deposition of the stack layers is recited, it is intended to cover the following "reverse" sequence, first CE layer, second IC layer, and third EC layer, as well the "forward" sequence described above. Both the forward and reverse sequences can function as reliable high-quality electrochromic devices. Further, it should be understood that conditions recited for depositing the various EC, IC, and CE materials recited here, are not limited to depositing such materials. Other materials may, in some cases, be deposited under the same or similar conditions. Moreover, the IC layer may be omitted in certain cases. Further, non-sputtering deposition conditions may be employed in some embodiments to create the same or similar deposited materials as those described in the context of sputtered materials.

Since the amount of charge each of the EC and the CE layers can safely hold varies, depending on the material used, the relative thickness of each of the layers may be controlled to match capacity as appropriate. In one embodiment, the electrochromic layer includes tungsten oxide and the counter electrode includes nickel tungsten tin oxide, and the ratio of thicknesses of the electrochromic layer to the counter electrode layer is between about 1.7:1 and 2.3:1, or between about 1.9:1 and 2.1:1 (with about 2:1 being a specific example).

Referring again to FIG. 5, operation 720, after the CE layer is deposited, the EC stack is complete. It should be noted that in FIG. 4, process operation 720 which refers to "depositing stack" means in this context, the EC stack plus the second TCO layer (sometimes referred to as the "ITO" when indium tin oxide is used to make the second TCO). Generally "stack" in this description refers to the EC-IC-CE layers; that is, the "EC stack." Referring again to FIG. 5, in one embodiment, represented by process 728, a TCO layer is deposited on the stack. Referring to FIG. 2, this would correspond to second TCO layer 630 on EC stack 625. Process flow 720 is finished once process 728 is complete. Typically, but not necessarily, a capping layer is deposited on the EC stack. In some embodiments, the capping layer is SiAlO, similar to the IC layer, e.g., The methods and conditions for forming the various layers (e.g., TCO layers, electrochromic layers, counter electrode layers, and ion conductor layers) are further described in U.S. patent application Ser. No. 12/645,111, filed Dec. 22, 2009, and titled "FABRICATION OF LOW DEFECTIVITY ELECTROCHROMIC DEVICES," which is herein incorporated by reference in its entirety.

As mentioned, the EC stack is fabricated in an integrated deposition system where the substrate does not leave the integrated deposition system at any time during fabrication of the stack. In one embodiment, the second TCO layer is also formed using the integrated deposition system where the substrate does not leave the integrated deposition system during deposition of the EC stack and the TCO layer. In one embodiment, all of the layers are deposited in the integrated deposition system where the substrate does not leave the integrated deposition system during deposition; that is, in one embodiment the substrate is a glass sheet and a stack including the EC layer, the IC layer and the CE layer, sandwiched between a first and a second TCO layer, is fabricated on the glass where the glass does not leave the integrated deposition system during deposition. In another implementation of this embodiment, the substrate is glass with a diffusion barrier deposited prior to entry in the integrated deposition system. In another implementation the substrate is glass and the diffusion barrier, a stack including the EC layer, the IC layer and the CE layer, sandwiched between a first and a second TCO layer, are all deposited on the glass where the glass does not leave the integrated deposition system during deposition.

As mentioned above, lithium may be provided with the EC, CE and/or IC layers as they are formed on the substrate. This may involve, for example, co-sputtering of lithium together with the other materials of a given layer (e.g., tungsten and oxygen). In certain embodiments described below the lithium is delivered via a separate process and allowed to diffuse or otherwise incorporate into the EC, CE and/or IC layers. In some embodiments, only a single layer in the electrochromic stack is lithiated. For example, only the anodically coloring CE layer is lithiated in some examples. In other cases, only the cathodically coloring EC layer is lithiated. In still other cases, only the IC layer is lithiated.

In some embodiments, the electrochromic stack includes a counter electrode layer in direct physical contact with an electrochromic layer, without an ion conducting layer in between. The electrochromic and/or counter electrode layer may include an oxygen-rich portion in contact with the other of these layers. The oxygen-rich portion includes the electrochromic material or counter electrode material, with a higher concentration of oxygen than in the remaining portion of the electrochromic layer and/or counter electrode layer. Electrochromic devices fabricated according to such a design are further discussed and described in U.S. Pat. No. 8,300,298, filed Apr. 30, 2010, which is incorporated by reference above.

In certain embodiments, fabrication of the electrochromic stack occurs in an integrated deposition system. Such an integrated system may allow for deposition of the various layers in the stack without breaking vacuum. In other cases, one or more layers in the stack may be deposited by a process that requires removal from a protected vacuum environment. For example, in some cases one or more layers (e.g., a cathodically coloring EC layer) is deposited on a substrate under vacuum using physical vapor deposition, then the substrate is removed from vacuum and an ion conductor layer is deposited using a sol-gel (or other non-vacuum) process, and then the substrate is returned to a vacuum environment for deposition of the anodically coloring counter electrode layer. Sol-gel processes involve producing solid materials from small molecules. Monomers are converted into a colloidal solution that acts as the precursor for an integrated network of discrete particles or network polymers.

Direct Lithiation of the Electrochromic Stack

In some embodiments, as mentioned above, intercalation of lithium ions is responsible for switching the optical state of an electrochromic device stack. It should be understood that the lithium may be introduced to the stack by various means. For example, lithium may be provided to one or more of these layers concurrently with the deposition of the material of the layer (e.g., concurrent deposition of lithium and tungsten oxide during formation of the EC layer). In some cases, however, the process of FIG. 5 may be punctuated with one or more operations for delivering lithium to the EC layer, the IC layer, and/or the CE layer. For example, lithium may also be introduced via one or more separate lithiation steps in which elemental lithium is delivered without substantial deposition of other material. Such lithiation step(s) may take place after deposition of the EC layer, the IC layer, and/or the CE layer. Alternatively (or in addition), one or more lithiation steps may take intermediate between steps performed to deposit a single layer. For example, a counter electrode layer may be deposited by first depositing a limited amount of nickel tungsten tin oxide, followed by directly depositing lithium, and then concluded by depositing additional amounts of nickel tungsten tin oxide. Such approaches may have certain advantages such as better separating the lithium from the ITO (or other material of a conductive layer) which improves adhesion and prevents undesirable side reactions. One example of a stack formation process employing a separate lithiation operation is presented in FIG. 6. In certain cases, the lithiation operation(s) takes place during while the deposition of a given layer is temporarily halted to allow lithium to be introduced before deposition of the layer is completed.

FIG. 6 depicts a process flow, 720a, for depositing the stack onto a substrate in a manner analogous to process 720 of FIG. 4. Process flow 720a includes depositing an EC layer, operation 722, depositing an IC layer, operation 724, and depositing a CE layer, operation 726, as described in relation to FIG. 5. However, process flow 720a differs from 720 by the addition of lithiation operations 723 and 727. In one embodiment, the lithium is physical vapor deposited using an integrated deposition system where the substrate does not leave the integrated deposition system at any time during the sequential deposition of the electrochromic layer, the ion conducting layer, the counter electrode layer, and the lithium.

In certain embodiments, lithium is deposited using a high voltage lithium cathode since there are not many secondary electron emissions during lithium sputtering. In some embodiments, the power delivered to effect sputtering is provided via direct current (DC). In other embodiments, pulsed DC/AC reactive sputtering is used. In one embodiment, where pulsed DC/AC reactive sputtering is used, the frequency is between about 20 kHz and about 400 kHz, in another embodiment between about 100 kHz and about 300 kHz, in yet another embodiment between about 200 kHz and about 250 kHz, in another embodiment about 220 kHz. A lithium target is used. In one embodiment the target is between about 80% (by weight) and 100% Li, in another embodiment between about 90% and about 99% Li, in another embodiment about 99% Li. Typically, due to the extreme reactivity of elemental lithium, lithiation is performed in an inert environment (e.g., argon alone). The power density used to sputter the lithium target is between about 1 Watts/$cm^2$ and about 10 Watts/$cm^2$ (determined based on the deposition surface area of the substrate); in another embodiment between about 2 Watts/$cm^2$ and about 4 Watts/$cm^2$; in yet another embodiment between about 2.5 Watts/$cm^2$ and about 3 Watts/$cm^2$; in another embodiment about 2.7 Watts/$cm^2$. In one embodiment the lithium sputtering is done at a pressure of between about 1 and about 20 mTorr, in another embodiment between about 5 and about 15 mTorr, in another embodiment about 10 mTorr. The above conditions may be used in any combination with one another to effect deposition of a high quality lithiation process.

In one embodiment, lithium is deposited on both the EC layer and the CE layer as depicted in dual lithiation process 720*a*. After the EC layer is deposited as described above, operation 722, lithium is sputtered on the EC layer; see operation 723. Thereafter, the IC layer is deposited, operation 724, followed by the CE layer, operation 726. Then lithium is deposited on the CE layer; see operation 727. In one embodiment where, e.g., the EC layer is tungsten oxide and about twice as thick as a nickel tungsten tin oxide CE layer, the total amount of lithium added to the stack is proportioned between the EC layer and the CE layer in a ratio of about 1:3 to 2:3; that is, the EC layer is sputtered with ⅓ of the total lithium and the CE layer with about ⅔ of the total lithium added to the stack. In a specific embodiment, the lithium added to the stack is proportioned between the EC layer and the CE layer in a ratio of about 1:2.

In one embodiment of the dual lithiation method, as explained above, the EC layer is treated with sufficient lithium to satisfy the requirements of the EC material irreversibly bound lithium (to, e.g., compensate "blind charge"). The lithium needed for reversible cycling is added to the CE layer (which also may have a blind charge). In certain embodiments, the lithium needed to compensate the blind charge can be titrated by monitoring optical density of the EC layer as lithium is added since the EC layer will not substantially change color until sufficient lithium has been added to fully compensate the blind charge.

In some cases, the lithiation processes are performed with isolation protocols in place. In one example, isolation protocols are performed with isolation valves within the integrated deposition system. For example, once a substrate is moved into a lithiation station, isolation valves shut to cut off the substrate from other stations and for example, flush with argon or evacuate to prepare for the lithiation. In another embodiment, the isolation is achieved by manipulating the controlled ambient environment, e.g., by creating a flow dynamic in the controlled ambient environment via differential pressures in a lithiation station of the integrated deposition system such that the lithium deposition is sufficiently isolated from other processes in the integrated deposition system. In another embodiment, a combination of the aforementioned conditions are used. For example valves can partially close (or the lithiation station can be configured so that the substrate entry and/or exit ports are minimized) and one or more flow dynamics are used to further isolate the lithiation process from adjoining processes. Referring again to FIG. 6, after the dual lithiation process as described in operations 722-727, the (second) TCO layer is deposited (operation 728) as described above.

FIG. 7 depicts another process flow, 720*b*, for depositing the stack onto a substrate. The process is analogous to process flow 700 of FIG. 4. Process flow 720*b* includes depositing an EC layer (operation 722) depositing an IC layer (operation 724) and depositing a CE layer (operation 726) as described in relation to FIG. 5. However, process flow 720*b* differs from 720 because there is an intervening lithiation operation 727. In this embodiment of the process of stack deposition, all the required lithium is added by delivering lithium to the CE layer and allowing the lithium to intercalate into the EC layer via diffusion through the IC layer during and/or after stack fabrication.

Multistep Thermochemical Conditioning

Referring again to FIG. 4, once the stack is deposited, the device is subjected to a multistep thermo-chemical conditioning (MTC) process (see block 730). Typically, the MTC process is performed only after all layers of the electrochromic stack have been formed. Note that the MTC process can be conducted entirely ex situ, i.e., outside of the integrated deposition system used to deposit the stack, or at least partially or wholly in situ, i.e., inside the deposition system without e.g., breaking vacuum or otherwise moving the substrate outside the controlled ambient environment used to fabricate the stack. In certain embodiments, the initial portions of the MTC process are performed in situ, and later portions of the process are performed ex situ. In certain embodiments, portions of the MTC are performed prior to deposition of certain layers, for example, prior to deposition of the second TCO layer.

In accordance with certain embodiments, the device is first thermally treated under non-reactive conditions (e.g., under an inert gas). In a specific embodiment, the device is heated at a temperature of between about 200° C. and about 350° C. for between about 5 minutes and about 30 minutes. In certain embodiments, this operation is conducted at low pressure or vacuum. Next, the device is subjected to a thermal treatment under reactive conditions. In some embodiments, this involves annealing the device in an oxidizing atmosphere (e.g., oxygen and inert gas at about 10-50 mTorr). In specific embodiments, the annealing is conducted at higher pressures than the non-reactive thermal processing step. In a specific embodiment, the device is heated at a temperature of between about 200° C. and about 350° C. for between about 3 minutes and about 20 minutes.

Optionally, after the oxidative anneal, the device is heated in air (ex situ). In one embodiment, the device is heated at between about 150° C. and about 500° C. for between about 1 minutes and about 60 minutes, in another embodiment at between about 200° C. and about 400° C. for between about 5 minutes and about 30 minutes. It should be understood that the MTC process may include two, three, or more separate and distinct operations. The three operations described here are provided solely for purposes of exemplifying the process. Further, the process conditions presented here are appropriate for architectural glass, but may have to be scaled for other applications, recognizing that the time to heat a device is dependent upon the size of the device. After the MTC process is complete, the device is ready for further processing.

As mentioned above, additional layers may be needed for improved optical performance (e.g., anti-reflectives), durability (due to physical handling), hermeticity, and the like. Addition of one or more of these layers is meant to be included in additional embodiments to those described above.

The lithiation and high temperature processing operations described herein can affect the composition and structure of various materials in the electrochromic stack. As one example, where an electrochromic stack includes a cathodically coloring EC layer in direct contact with an anodically coloring CE layer (with no separate ion conducting layer deposited in between them), the thermal processing operations can change the composition and/or structure of the cathodically coloring EC and anodically coloring CE layers at an interfacial region between these layers, to thereby form a region that has ion conducting, electronically insulating properties. Similarly, lithiation and thermal processing operations can affect the composition and structure of an anodically coloring counter electrode layer. In various cases an anodically coloring counter electrode layer is improved through such operations.

Fabrication Process for Completion of the Device

Again referring to FIG. 4, a second laser scribe (block 740) is performed. Laser scribe 740 is performed across the length of the substrate near the outer edge of the stack, on the two sides of the substrate perpendicular to the first laser scribe. FIG. 3 shows the location of the trenches, 626, formed by laser scribe 740. This scribe is also performed all the way through the first TCO (and diffusion barrier if present) to the substrate in order to further isolate the isolated portion of the first TCO layer (where the first bus bar will be connected) and to isolate the stack coating at the edges (e.g., near a mask) to minimize short circuits due to deposition roll off of the stack layers.

Next, a third laser scribe, 745, is performed along the perimeter of the stack near the edge of the substrate opposite the first laser scribe and parallel to the first laser scribe. This third laser scribe is only deep enough to isolate the second TCO layer and the EC stack, but not cut through the first TCO layer. Referring to FIG. 2, laser scribe 745 forms a trench, 635, which isolates the uniform conformal portions EC stack and second TCO from the outermost edge portions which can suffer from roll off (e.g., as depicted in FIG. 2, the portion of layers 625 and 630 near area 650 isolated by cutting trench 635) and thus cause shorts between the first and second TCO layers in region 650 near where the second bus bar will be attached. Trench 635 also isolates roll off regions of the second TCO from the second bus bar. Trench 635 is also depicted in FIG. 3.

Referring again to process 700, in FIG. 4, after the third laser scribe, the bus bars are attached, process 750. After the bus bars are connected, the device is integrated into an IGU, process 755. The IGU is formed by placing a gasket or seal (e.g., made of PVB (polyvinyl butyral), PIB or other suitable elastomer) around the perimeter of the substrate. Typically, but not necessarily, a desiccant is included in the IGU frame or spacer bar during assembly to absorb any moisture. In one embodiment, the seal surrounds the bus bars and electrical leads to the bus bars extend through the seal. After the seal is in place, a second sheet of glass is placed on the seal and the volume produced by the substrate, the second sheet of glass and the seal is filled with inert gas, typically argon. Once the IGU is complete, process 700 is complete. The completed IGU can be installed in, for example, a pane, frame or curtain wall and connected to a source of electricity and a controller to operate the electrochromic window.

In addition to the process steps described in relation to the methods above, an edge deletion step or steps may be added to the process flow. Edge deletion is part of a manufacturing process for integrating the electrochromic device into, e.g., a window, where the roll off (as described in relation to FIG. 2) is removed prior to integration of the device into the window. Where unmasked glass is used, removal of the coating that would otherwise extend to underneath the IGU frame (undesirable for long term reliability) is removed prior to integration into the IGU. This edge deletion process is meant to be included in the methods above as an alternative embodiment to those listed above.

In certain embodiments, a different process flow may be used to fabricate an electrochromic device. Alternative process flows are further discussed in U.S. patent application Ser. No. 14/362,863, filed Jun. 4, 2014, and titled "THIN-FILM DEVICES AND FABRICATION," which is herein incorporated by reference in its entirety. For example, an EC device may have no isolation scribes if such processes are used.

Integrated Deposition System

As explained above, an integrated deposition system may be employed to fabricate electrochromic devices on, for example, architectural glass. As described above, the electrochromic devices are used to make IGUs which in turn are used to make electrochromic windows. The term "integrated deposition system" means an apparatus for fabricating electrochromic devices on optically transparent and translucent substrates. The apparatus has multiple stations, each devoted to a particular unit operation such as depositing a particular component (or portion of a component) of an electrochromic device, as well as cleaning, etching, and temperature control of such device or portion thereof. The multiple stations are fully integrated such that a substrate on which an electrochromic device is being fabricated can pass from one station to the next without being exposed to an external environment. Integrated deposition systems herein operate with a controlled ambient environment inside the system where the process stations are located. A fully integrated system allows for better control of interfacial quality between the layers deposited. Interfacial quality refers to, among other factors, the quality of the adhesion between layers and the lack of contaminants in the interfacial region. The term "controlled ambient environment" means a sealed environment separate from an external environment such as an open atmospheric environment or a clean room. In a controlled ambient environment at least one of pressure and gas composition is controlled independently of the conditions in the external environment. Generally, though not necessarily, a controlled ambient environment has a pressure below atmospheric pressure; e.g., at least a partial vacuum. The conditions in a controlled ambient environment may remain constant during a processing operation or may vary over time. For example, a layer of an electrochromic device may be deposited under vacuum in a controlled ambient environment and at the conclusion of the deposition operation, the environment may be backfilled with purge or reagent gas and the pressure increased to, e.g., atmospheric pressure for processing at another station, and then a vacuum reestablished for the next operation and so forth.

In one embodiment, the system includes a plurality of deposition stations aligned in series and interconnected and operable to pass a substrate from one station to the next without exposing the substrate to an external environment. The plurality of deposition stations comprise (i) a first deposition station containing one or more targets for depositing a cathodically coloring electrochromic layer; (ii) a second deposition station containing one or more targets for depositing an ion conducting layer; and (iii) a third deposition station containing one or more targets for depositing a counter electrode layer. The second deposition station may be omitted in certain cases. For instance, the apparatus may not include any target for depositing a separate ion conductor layer.

The system also includes a controller containing program instructions for passing the substrate through the plurality of stations in a manner that sequentially deposits on the substrate (i) an electrochromic layer, (ii) an (optional) ion conducting layer, and (iii) a counter electrode layer to form a stack. In one embodiment, the plurality of deposition stations are operable to pass a substrate from one station to the next without breaking vacuum. In another embodiment, the plurality of deposition stations are configured to deposit the electrochromic layer, the optional ion conducting layer, and the counter electrode layer on an architectural glass substrate. In another embodiment, the integrated deposition system includes a substrate holder and transport mechanism operable to hold the architectural glass substrate in a vertical orientation while in the plurality of deposition stations. In yet another embodiment, the integrated deposition system includes one or more load locks for passing the substrate between an external environment and the integrated deposition system. In another embodiment, the plurality of deposition stations include at least two stations for depositing a layer selected from the group consisting of the cathodically coloring electrochromic layer, the ion conducting layer, and the anodically coloring counter electrode layer.

In some embodiments, the integrated deposition system includes one or more lithium deposition stations, each including a lithium containing target. In one embodiment, the integrated deposition system contains two or more lithium deposition stations. In one embodiment, the integrated deposition system has one or more isolation valves for isolating individual process stations from each other during operation. In one embodiment, the one or more lithium deposition stations have isolation valves. In this document, the term "isolation valves" means devices to isolate depositions or other processes being carried out one station from processes at other stations in the integrated deposition system. In one example, isolation valves are physical (solid) isolation valves within the integrated deposition system that engage while the lithium is deposited. Actual physical solid valves may engage to totally or partially isolate (or shield) the lithium deposition from other processes or stations in the integrated deposition system. In another embodiment, the isolation valves may be gas knifes or shields, e.g., a partial pressure of argon or other inert gas is passed over areas between the lithium deposition station and other stations to block ion flow to the other stations. In another example, isolation valves may be an evacuated regions between the lithium deposition station and other process stations, so that lithium ions or ions from other stations entering the evacuated region are removed to, e.g., a waste stream rather than contaminating adjoining processes. This is achieved, e.g., via a flow dynamic in the controlled ambient environment via differential pressures in a lithiation station of the integrated deposition system such that the lithium deposition is sufficiently isolated from other processes in the integrated deposition system. Again, isolation valves are not limited to lithium deposition stations.

FIG. 8A, depicts in schematic fashion an integrated deposition system 800 in accordance with certain embodiments. In this example, system 800 includes an entry load lock, 802, for introducing the substrate to the system, and an exit load lock, 804, for removal of the substrate from the system. The load locks allow substrates to be introduced and removed from the system without disturbing the controlled ambient environment of the system. Integrated deposition system 800 has a module, 806, with a plurality of deposition stations; an EC layer deposition station, an IC layer deposition station and a CE layer deposition station. In the broadest sense, integrated deposition systems herein need not have load locks, e.g., module 806 could alone serve as the integrated deposition system. For example, the substrate may be loaded into module 806, the controlled ambient environment established and then the substrate processed through various stations within the system. Individual stations within an integrated deposition systems can contain heaters, coolers, various sputter targets and means to move them, RF and/or DC power sources and power delivery mechanisms, etching tools e.g., plasma etch, gas sources, vacuum sources, glow discharge sources, process parameter monitors and sensors, robotics, power supplies, and the like.

Figure 8B:
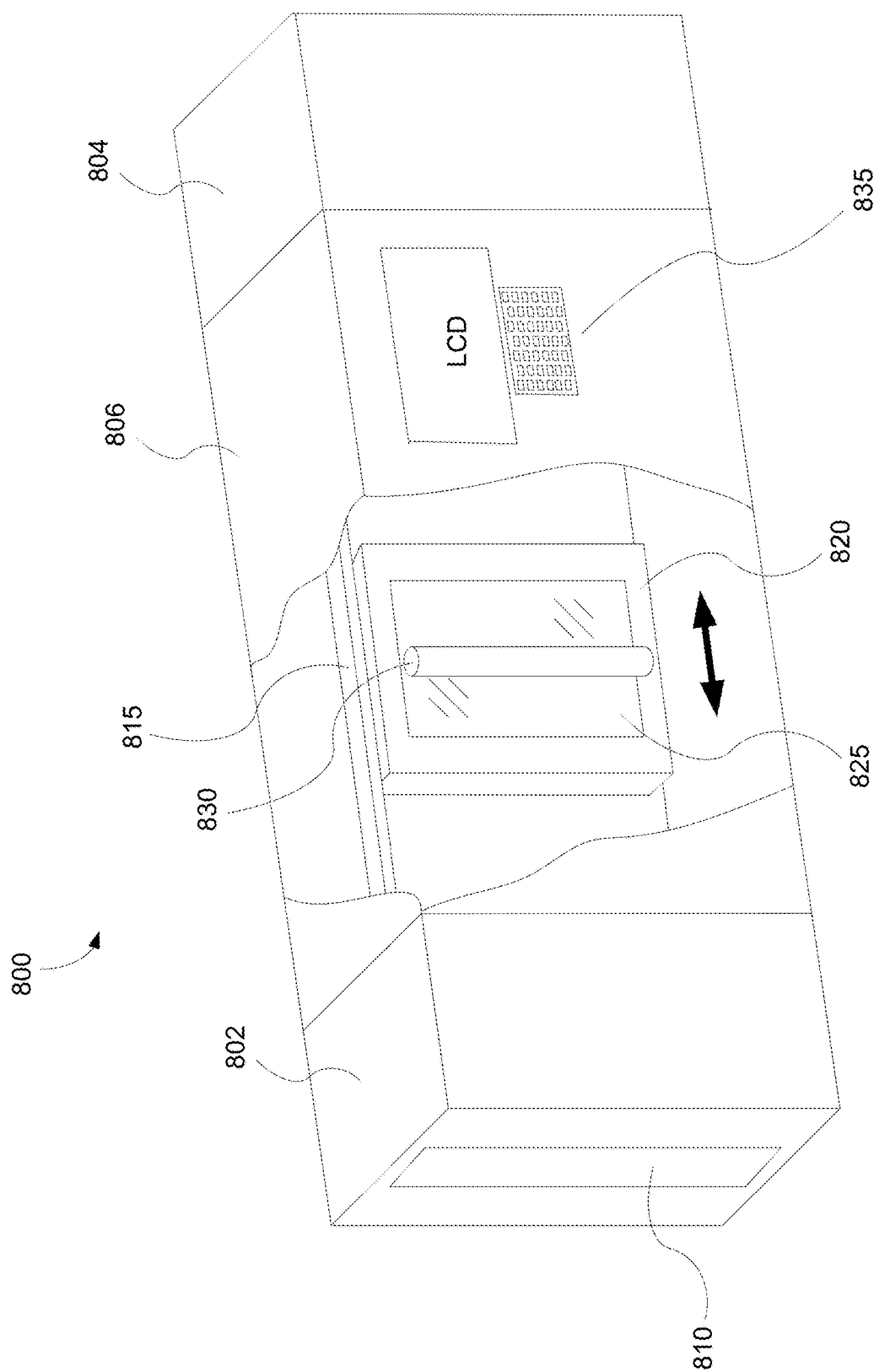
FIG. 8B depicts an integrated deposition system in a perspective view.

FIG. 8B depicts a segment (or simplified version) of integrated deposition system 800 in a perspective view and with more detail including a cutaway view of the interior. In this example, system 800 is modular, where entry load lock 802 and exit load lock 804 are connected to deposition module 806. There is an entry port, 810, for loading, for example, architectural glass substrate 825 (load lock 804 has a corresponding exit port). Substrate 825 is supported by a pallet, 820, which travels along a track, 815. In this example, pallet 820 is supported by track 815 via hanging but pallet 820 could also be supported atop a track located near the bottom of apparatus 800 or a track, e.g., mid-way between top and bottom of apparatus 800. Pallets for fabricating electrochromic devices are further described in P.C.T. Patent Application No. PCT/US14/41569, filed Jun. 9, 2014, and titled "GLASS PALLET FOR SPUTTERING SYSTEMS," which is herein incorporated by reference in its entirety. Pallet 820 can translate (as indicated by the double headed arrow) forward and/or backward through system 800. For example during lithium deposition, the substrate may be moved forward and backward in front of a lithium target, 830, making multiple passes in order to achieve a desired lithiation. Pallet 820 and substrate 825 are in a substantially vertical orientation. A substantially vertical orientation is not limiting, but it may help to prevent defects because particulate matter that may be generated, e.g., from agglomeration of atoms from sputtering, will tend to succumb to gravity and therefore not deposit on substrate 825. Also, because architectural glass substrates tend to be large, a vertical orientation of the substrate as it traverses the stations of the integrated deposition system enables coating of thinner glass substrates since there are less concerns over sag that occurs with thicker hot glass.

Target 830, in this case a cylindrical target, is oriented substantially parallel to and in front of the substrate surface where deposition is to take place (for convenience, other sputter means are not depicted here). Substrate 825 can translate past target 830 during deposition and/or target 830 can move in front of substrate 825. The movement path of target 830 is not limited to translation along the path of substrate 825. Target 830 may rotate along an axis through its length, translate along the path of the substrate (forward and/or backward), translate along a path perpendicular to the path of the substrate, move in a circular path in a plane parallel to substrate 825, etc. Target 830 need not be cylindrical, it can be planar or any shape necessary for deposition of the desired layer with the desired properties. Also, there may be more than one target in each deposition station and/or targets may move from station to station depending on the desired process.

Integrated deposition system 800 also has various vacuum pumps, gas inlets, pressure sensors and the like that establish and maintain a controlled ambient environment within the system. These components are not shown, but rather would be appreciated by one of ordinary skill in the art. System 800 is controlled, e.g., via a computer system or other controller, represented in FIG. 8B by an LCD and keyboard, 835. One of ordinary skill in the art would appreciate that embodiments herein may employ various processes involving data stored in or transferred through one or more computer systems. The present embodiments also relate to the apparatus, such computers and microcontrollers, for performing these operations. These apparatus and processes may be employed to deposit electrochromic materials of methods and apparatus described herein designed to implement them. The control apparatus may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform and/or control the required method and processes.

As mentioned, the various stations of an integrated deposition system may be modular, but once connected, form a continuous system where a controlled ambient environment is established and maintained in order to process substrates at the various stations within the system. FIG. 8C depicts integrated deposition system 800a, which is like system 800, but in this example each of the stations is modular, specifically, an EC layer station 806a, an IC layer station 806b and a CE layer station 806c. In a similar embodiment, the IC layer station 806b is omitted. Modular form is not necessary, but it is convenient, because depending on the need, an integrated deposition system can be assembled according to custom needs and emerging process advancements. For example, FIG. 8D depicts an integrated deposition system, 800b, with two lithium deposition stations, 807a and 807b. System 800b is, e.g., equipped to carry out methods as described above, such as the dual lithiation method described in conjunction with FIG. 6. System 800b could also be used to carry out a single lithiation method, e.g., that described in conjunction with FIG. 7, for example by only utilizing lithium station 807b during processing of the substrate. But with modular format, e.g., if single lithiation is the desired process, then one of the lithiation stations is redundant and system 800c, as depicted in FIG. 8E can be used. System 800c has only one lithium deposition station, 807.

Systems 800b and 800c also have a TCO layer station, 808, for depositing the TCO layer on the EC stack. Depending on the process demands, additional stations can be added to the integrated deposition system, e.g., stations for cleaning processes, laser scribes, capping layers, MTC, etc.

Experimental Results

Experimental results have shown that the disclosed NiWSnO materials exhibit very high quality coloring characteristics. In particular, the NiWSnO materials are very clear (transparent) in their untinted state, having less color (particularly yellow color) as compared to other materials that are somewhat colored in their untinted states.

NiWSnO Deposition

Mixed nickel tungsten tin oxide, NiWSnO, was deposited using repeated deposition of very thin layers of sputtered material as the substrate was rastered back-and-forth in a deposition chamber. Reactive sputtering of NiW alloy and Sn metal targets in a mixture of argon and molecular oxygen with a chamber pressure of approximately 10 mTorr was used. The NiW alloy target was produced using a Hot Isostatic Press (HIP) method. The power to each target was independently controlled using two synchronized pulsed DC power supplies. The ratio of Sn to Ni+W was adjusted by varying the power ratio between the two targets. The thickness of the NiWSnO for a given set of power conditions could be changed by increasing or decreasing the speed of the substrate as it moves through the deposition chamber. In order to achieve the desired thickness of the entire counter-electrode, the number of passes in front of the targets was increased or decreased as needed. The degree of oxidation of the film was controlled by adjusting the partial pressures of Ar and $O_2$ in the sputtering gas, as well as the total pressure. Through the manipulation of these process parameters, the ratio of NiW:Sn:O could be controlled. Heaters were used for temperature variation, but the highest-performance films and devices were deposited without additional heating. The substrate temperature was typically less than 100° C.

As an example, a high performance counter electrode was achieved by sputtering in a pure oxygen environment with power and substrate speed settings chosen to achieve a thickness of less than 5 nm per pass. More than 150 passes through the deposition system were performed to build film thickness. The power supplies for the two sputter targets were chosen such that the NiW power (6 kW) was about 12× the Sn power (0.5 kW). The resulting Ni:(W+Sn) ratio was approximately 2, measured using RBS. The performance of a device with this counter electrode formulation is listed below.

Example of Performance Improvement Resulting from NIWSnO Material

The table below compares key metrics for a device with a NiWSnO anodically coloring counter electrode compared to an all solid state and inorganic electrochromic device having a NiWO anodically coloring counter electrode layer. Other than the different materials of the counter electrode, the devices were otherwise identical. In this example the devices both used tungsten oxide cathodically coloring electrochromic layers. The device with NiWSnO counter electrode has a small increase in photopic transmission and a dramatic decrease in the CIE coordinate (b*) that quantifies the yellow appearance of the device in transmission. In other words, the significantly lower b* of the device having the NiWSnO counter electrode indicates that this device appeared less yellow in its neutral/clear state. Since the counter-electrode is required to function as a charge storage layer, the table below shows that the improvements in transmission in the neutral state are not gained at the expense of device coloration, which is slightly improved relative to the comparison device having the NiWO counter electrode.

|                                          | NiWO | NiWSnO |
| ---------------------------------------- | ---- | ------ |
| Neutral State Transmitted b*             | 16.9 | 11.3   |
| Neutral State Photopic Transmission (% T)| 70.0 | 71.3   |
| Color State Transmission (% T)           | 2.1  | 1.6    |

Although the foregoing embodiments have been described in some detail to facilitate understanding, the described embodiments are to be considered illustrative and not limiting. It will be apparent to one of ordinary skill in the art that certain changes and modifications can be practiced within the scope of the appended claims.

What is claimed is:

1. A method of fabricating an electrochromic device, the method comprising:
    (a) forming either an electrochromic layer comprising tungsten oxide or a counter electrode layer comprising nickel-tungsten-tin-oxide (NiWSnO),
    wherein the electrochromic layer or the counter electrode layer formed in (a) includes an oxygen-rich portion comprising an oxygen-rich tungsten oxide or an oxygen-rich NiWSnO, respectively;
    (b) forming the other of the electrochromic layer comprising the tungsten oxide and the counter electrode layer comprising the NiWSnO directly on the electrochromic layer or the counter electrode layer formed in (a), without first providing an ion conducting electronically insulating layer between the electrochromic layer and the counter electrode layer; and
    (c) converting at least a portion of the oxygen-rich tungsten oxide or the oxygen-rich NiWSnO to a material that is substantially ion conducting and substantially electronically insulating.

2. The method of claim 1, wherein the electrochromic layer is deposited in (a) and comprises the oxygen-rich tungsten oxide, and wherein the counter electrode layer is deposited in (b) directly in contact with the oxygen-rich tungsten oxide.

3. The method of claim 2, wherein (c) comprises converting at least a portion of oxygen-rich tungsten oxide to the material that is substantially ion conducting and substantially electronically insulating.

4. The method of claim 1, wherein the counter electrode layer is deposited in (a) and comprises the oxygen-rich NiWSnO, and wherein the electrochromic layer is deposited in (b) directly in contact with the oxygen-rich NiWSnO.

5. The method of claim 4, wherein (c) comprises converting at least a portion of the oxygen-rich NiWSnO to the material that is substantially ion conducting and substantially electronically insulating.

6. The method of claim 1, wherein the oxygen-rich portion of the electrochromic layer or the counter electrode layer formed in (a) is provided as a distinct oxygen-rich sub-layer within the electrochromic layer or the counter electrode layer formed in (a).

7. The method of claim 1, wherein the oxygen-rich portion of the electrochromic layer or the counter electrode layer formed in (a) is provided within a graded layer.

8. The method of claim 7, wherein the graded layer comprises an oxygen concentration gradient in a direction normal to a surface of the electrochromic layer and the counter electrode layer.

9. The method of claim 1, wherein the electrochromic layer is doped with one or more of molybdenum, titanium, and vanadium.

10. An integrated deposition system for fabricating an electrochromic stack, the integrated deposition system comprising:
    a plurality of deposition stations aligned in series and interconnected and operable to pass a substrate from one station to the next without exposing the substrate to an external environment,
    wherein the plurality of deposition stations comprise
        (i) a first deposition station containing a first one or more material sources for depositing a cathodically coloring layer;
        (ii) a second deposition station containing a second one or more material sources for depositing an anodically coloring layer comprising nickel-tungsten-tin-oxide (NiWSnO); and
    a controller comprising program instructions for passing the substrate through the plurality of deposition stations in a manner that deposits on the substrate (i) the cathodically coloring layer, and (ii) the anodically coloring layer in direct contact with each other.

11. The integrated deposition system of claim 10, wherein the NiWSnO comprises an atomic ratio of Ni:(W+Sn) that is between about 1:1 and 4:1.

12. The integrated deposition system of claim 11, wherein the NiWSnO comprises an atomic ratio of Ni:(W+Sn) that is between about 1:1 and 3:1.

13. The integrated deposition system of claim 12, wherein the NiWSnO comprises an atomic ratio of Ni:(W+Sn) that is between about 1.5:1 and 2.5:1.

14. The integrated deposition system of claim 13, wherein the NiWSnO comprises an atomic ratio of Ni:(W+Sn) that is between about 2:1 and 2.5:1.

15. The integrated deposition system of claim 10, wherein the NiWSnO comprises an atomic ratio of W:Sn that is between about 1:1 and 3:1.

16. The integrated deposition system of claim 15, wherein the NiWSnO comprises an atomic ratio of W:Sn that is between about 1.5:1 and 2.5:1.

17. The integrated deposition system of claim 16, wherein the NiWSnO comprises an atomic ratio of W:Sn that is between about 1.5:1 and 2:1.

18. The integrated deposition system of claim 10, wherein at least one of the second one or more material sources for depositing the anodically coloring layer comprise an elemental metal selected from the group consisting of: nickel, tungsten, and tin.

19. The integrated deposition system of claim 10, wherein at least one of the second one or more material sources for depositing the anodically coloring layer comprise an alloy comprising two or more metals selected from the group consisting of: nickel, tungsten, and tin.

20. The integrated deposition system of claim 10, further comprising one or more lithium sources.

21. The integrated deposition system of claim 20, wherein the controller comprises instructions for passing the substrate through the plurality of deposition stations in a manner that deposits lithium on the cathodically coloring layer and/or on the anodically coloring layer.

* * * * *